US008335026B2

(12) United States Patent
Muramatsu

(10) Patent No.: US 8,335,026 B2
(45) Date of Patent: Dec. 18, 2012

(54) IMAGE FORMING APPARATUS AND COLOR SHIFT CORRECTION METHOD THEREOF

(75) Inventor: Mizuki Muramatsu, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 724 days.

(21) Appl. No.: 12/415,131

(22) Filed: Mar. 31, 2009

(65) Prior Publication Data

US 2009/0251747 A1 Oct. 8, 2009

(30) Foreign Application Priority Data

Apr. 7, 2008 (JP) ................................. 2008-099802

(51) Int. Cl.
*G03F 3/08* (2006.01)

(52) U.S. Cl. ........ 358/518; 358/500; 358/501; 358/505; 399/301; 399/298

(58) Field of Classification Search .................. 358/500, 358/501, 505, 518; 399/301, 298
See application file for complete search history.

(56) References Cited

U.S. PATENT DOCUMENTS

| | | | | |
|---|---|---|---|---|
| 5,596,640 | A * | 1/1997 | Ohta | 380/243 |
| 5,715,498 | A | 2/1998 | Takeuchi et al. | |
| 7,436,416 | B2 | 10/2008 | Muramatsu | |
| 2004/0190019 | A1 * | 9/2004 | Li et al. | 358/1.9 |
| 2007/0258103 | A1 | 11/2007 | Muramatsu | |
| 2008/0150995 | A1 * | 6/2008 | Srinivasan et al. | 347/19 |
| 2008/0193151 | A1 * | 8/2008 | Shim et al. | 399/40 |
| 2009/0021756 | A1 | 1/2009 | Muramatsu | |

FOREIGN PATENT DOCUMENTS

| | | |
|---|---|---|
| JP | 8-85237 | 4/1996 |
| JP | 2002-116394 | 4/2002 |
| JP | 2003-241131 | 8/2003 |
| JP | 2004-170755 | 6/2004 |

* cited by examiner

*Primary Examiner* — King Poon
*Assistant Examiner* — Jamares Q Washington
(74) *Attorney, Agent, or Firm* — Fitzpatrick, Cella, Harper & Scinto

(57) ABSTRACT

In an image forming apparatus that reads an original and forms an image of the original that has been read, a skew amount of the original is calculated when the original has been read and a shift amount of each color of image data in image formation is obtained from a storage unit. A color shift correction amount for correcting color shift in an output image is calculated based on the calculated skew amount and the stored shift amount of each color, and the color shift is corrected based on that color shift correction amount.

7 Claims, 35 Drawing Sheets

FIG. 11

| | REGION | WIDTH (mm) | TILT (mm) |
|---|---|---|---|
| Y | REGION 1 | L 1 | m 1 |
| | REGION 2 | L 2 | m 2 |
| | REGION 3 | L 3 | m 3 |
| M | REGION | WIDTH (mm) | TILT (mm) |
| | REGION 1 | . . . | . . . |
| | REGION 2 | . . . | . . . |
| | REGION 3 | . . . | . . . |
| C | REGION | WIDTH (mm) | TILT (mm) |
| | REGION 1 | . . . | . . . |
| | REGION 2 | . . . | . . . |
| | REGION 3 | . . . | . . . |
| K | REGION | WIDTH (mm) | TILT (mm) |
| | REGION 1 | . . . | . . . |
| | REGION 2 | . . . | . . . |
| | REGION 3 | . . . | . . . |

FIG. 18A
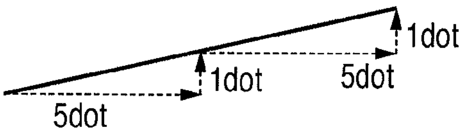
FIG. 18B
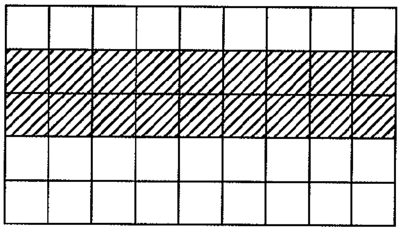
FIG. 18C
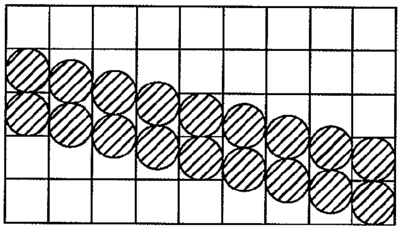
FIG. 18D
| Δy | 0 | 0.25 | 0.5 | 1.75 | 1 | 1.25 | 1.5 | 1.75 | 2 |
|---|---|---|---|---|---|---|---|---|---|
| k | 0 | 0 | 0 | 0 | 1 | 1 | 1 | 0 | 2 |
| $\beta = \Delta y - k$ | 0 | 0.25 | 0.5 | 0.75 | 0 | 0.25 | 0.5 | 0.75 | 0 |
| $\alpha = 1 - \beta$ | 1 | 0.75 | 0.5 | 0.25 | 1 | 0.75 | 0.5 | 0.25 | 1 |
FIG. 18E
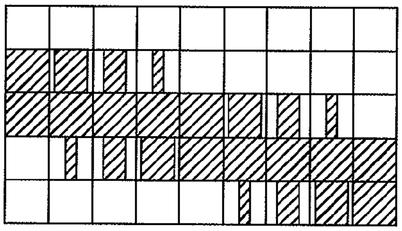
FIG. 18F
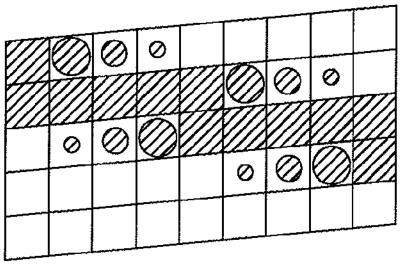

FIG. 19A
| | | | | | | | | | |
|---|---|---|---|---|---|---|---|---|---|
| Δy | 0 | 0.25 | 0.5 | 0.75 | 1 | 1.25 | 1.5 | 1.75 | 2 |
| k | 0 | 0 | 0 | 0 | 1 | 1 | 1 | 1 | 2 |
| $\beta = \Delta y - k$ | 0 | 0 | 0 | 0 | 0 | 0 | 0 | 0 | 0 |
| $\alpha = 1 - \beta$ | 1 | 1 | 1 | 1 | 1 | 1 | 1 | 1 | 1 |
FIG. 19B
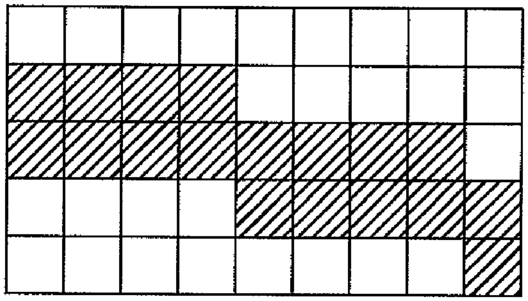
FIG. 19C
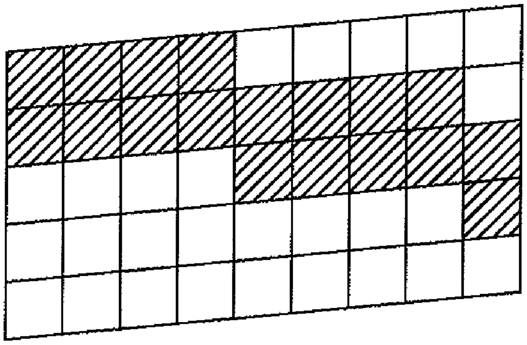

IMAGE FORMING APPARATUS AND COLOR SHIFT CORRECTION METHOD THEREOF

BACKGROUND OF THE INVENTION

1. Field of the Invention

The present invention relates to image forming apparatuses that read an original and form an image of the original that has been read and to color shift correction methods thereof.

2. Description of the Related Art

In recent years, in order to increase the speed of image formation, the same number of developing devices and photosensitive members as the number of coloring materials have been provided in electrophotographic method color image forming apparatuses, and there has been an increasing number of color image forming apparatuses of a method (tandem method) in which images of different colors are transferred successively onto an image carrying belt and onto a recording medium.

By using this method, throughput can be greatly increased, but on the other hand color shift is produced originating in poor uniformity or accuracy of installment positioning of the lenses of a deflection scanning apparatus, or accuracy of positioning in assembling the deflection scanning apparatus itself to the image forming apparatus main unit.

That is, tilting or curvature is produced in the scanning lines and the extent of this varies for each color, thereby producing a problem of color shift due to positional shifting of each color on the transfer paper, and as a result it becomes difficult to achieve high quality color images.

On the other hand, since tilting occurs in an original itself due to the position in which the original is placed on the original platform in original reading sections of color image forming apparatuses, it is necessary to perform correction for each original at the time of reading, which necessitates a considerable processing capacity.

As a method for countering this color shift, Japanese Patent Laid-Open No. 2002-116394 for example describes a method in which an optical sensor is used at an assembly step of the deflection scanning apparatus to measure a magnitude of bending in the scanning lines, and the lens is fastened after it is mechanically rotated to adjust the bending of the scanning lines.

Furthermore, Japanese Patent Laid-Open No. 2003-241131 describes a method in which the magnitude of tilting of the scanning lines is measured using an optical sensor at a step of installing the deflection scanning apparatus to the image forming apparatus main unit, and the deflection scanning apparatus is mechanically tilted to adjust the tilt of the scanning lines when installing to the apparatus main unit.

Here, in correcting an optical path of an optical system, it is necessary to mechanically operate a correction optical system including a light source and an f-theta lens, and mirrors or the like on the optical path, then align the positions of test toner images. For this reason, the methods described in Japanese Patent Laid-Open No. 2002-116394 and Japanese Patent Laid-Open No. 2003-241131 require high-precision moving components, and this incurs much higher costs.

Further still, optical path corrections in optical systems require time until correction is completed, and therefore although it is impossible to carry out corrections frequently, the shifting in the optical path length changes by being affected by temperature increases or the like in the mechanical units. For this reason, the influence of temperature increases in the mechanical units cannot be eliminated even though corrections are carried out at a certain point in time, and therefore it is difficult to prevent color shift by correcting the optical path of the optical system.

On the other hand, Japanese Patent Laid-Open No. 2004-170755 describes a method in which an optical sensor is used to measure magnitudes of tilting and curvature in the scanning lines, then bitmap image data is corrected so as to offset these and form a corrected image thereof. This method performs corrections electrically by processing the image data, and therefore it can handle color shift at a lower cost than the methods described in Japanese Patent Laid-Open No. 2002-116394 and Japanese Patent Laid-Open No. 2003-241131 in that mechanical adjustment members and adjustment steps during assembly are not required.

Furthermore, in Japanese Patent Laid-Open No. 08-85237, image processing such as color processing and halftone processing is carried out, and raster image data is formed in a bitmap memory for each color component (C, M, Y, and K). After this, output coordinate positions of the image data for each color are automatically converted to output coordinate positions in which registration shifting has been corrected. And a configuration is disclosed in which positions of an optical beam modulated by a modifying means based on the converted image data for each color are modified by amounts smaller than the unit of the smallest dot of the color signal.

However, in electrical color shift corrections, which are one method for handling color shift, it is necessary to execute the color shift corrections after executing skew corrections at the reading section side for an original that has been placed diagonally (hereinafter referred to as "skewed original") in the original reading section. However, in ordinary skew corrections, the skew amount varies for each original reading, which is a problem in that high speed processing capabilities are necessary for calculating the tilting.

Furthermore, by doubling the processing with skew correction processing and color shift correction processing, a possibility is sufficiently anticipated that deterioration in correction accuracy and reductions in calculation processing will occur. Further still, there is a problem in that apparatuses without a skew correction function cannot execute this.

Furthermore, techniques are conceivable of supplementing electrical color shift corrections in devices having a skew correction processing function, however these are difficult to realize since skew corrections are uniquely determined for RGB originals, while the correction amounts vary for each color of CMYK in regard to color shift corrections.

SUMMARY OF THE INVENTION

The present invention provides an image forming apparatus that achieves skew correction processing for an original and electrical correction processing for color shift using a one-time correction process.

According to one aspect of the present invention, there is provided an image forming apparatus that reads an original and forms an image of the original that has been read, comprising: a skew amount calculation unit that calculates a skew amount of the original when the original has been read; an obtaining unit that obtains from a storage unit a shift amount of each color of image data in image formation; a color shift correction amount calculation unit that calculates a color shift correction amount for correcting color shift in an output image based on the calculated skew amount and the stored shift amount of each color; and a color shift correction unit that corrects the color shift based on the calculated color shift correction amount.

According to another aspect of the present invention, there is provided a color shift correction method of an image forming apparatus that reads an original and forms an image of the original that has been read, comprising: calculating a skew amount of the original when the original has been read; obtaining from a storage unit a shift amount of each color of image data in image formation; calculating a color shift correction amount for correcting color shift in an output image based on the calculated skew amount and the obtained shift amount of each color; and correcting the color shift based on the calculated color shift correction amount.

Further features of the present invention will become apparent from the following description of exemplary embodiments (with reference to the attached drawings).

BRIEF DESCRIPTION OF THE DRAWINGS

FIG. 11 is diagram showing one example of color shift profile information stored in a color shift amount storage section 1021.

FIG. 18A to FIG. 18F are diagrams for describing sub-pixel correction processing in a tone value conversion section 1504.

FIG. 19A to FIG. 19C are diagrams showing a tone value conversion table, a bitmap image, and an exposure image when sub-pixel correction processing is not to be carried out.

DESCRIPTION OF THE EMBODIMENTS

Hereinafter, detailed description is given of preferred embodiments for executing the present invention with reference to the accompanying drawings. It should be noted that the present embodiment is described using a multifunction peripheral (MFP) as an example of an image forming apparatus, the MFP being provided with a plurality of functions (multiple functions) such as printing, copying, faxing, and scanning and the like, and capable of being connected to a network.

MFP Configuration

Figure 1:
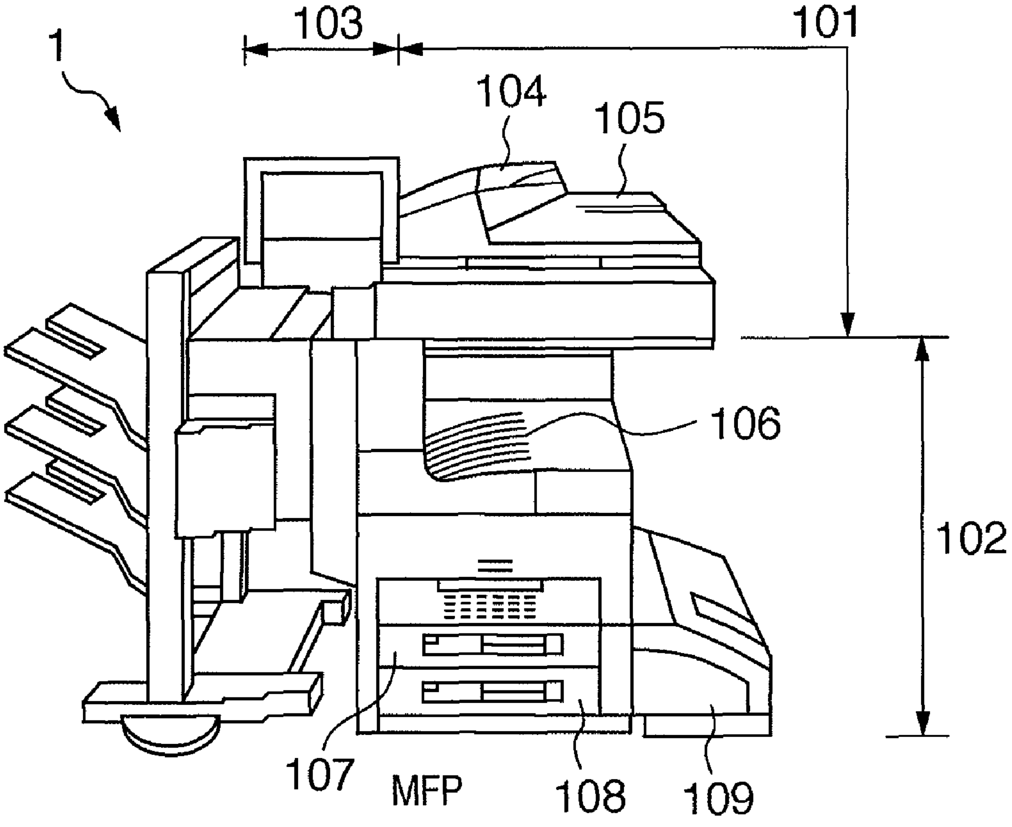
FIG. 1 is an external view showing one example of a configuration of a digital copier, which is one specific example of an MFP 1.

FIG. 1 is an external view showing one example of a configuration of a digital copier, which is one specific example of an MFP. As shown in FIG. 1, an MFP 1 is broadly divided into an image reading section 101 that reads images of originals, a printer section 102 that reproduces image data that has been read by the image reading section 101, and an operation section 103 for specifying various operational settings of the MFP 1.

The image reading section 101 is a scanner that optically reads an original at a resolution of 600 dpi (dots per inch) for example and carries out digital signal processing. When a user sets original papers in a tray 104 of an original feeder 105 and commences a startup instruction for reading from the operation section 103, a controller CPU of the MFP 1 gives instruction to the image reading section 101. Here, the original feeder 105 feeds the original papers sheet by sheet and the image reading section 101 carries out reading operations of images of the originals.

The operation section 103 is a user interface for performing settings instructions and status indications during copying operations, and specifying various operational settings.

The printer section 102 is a printer engine that performs a full color print on a specified paper at a resolution of 600 dpi of an image corresponding to the image of the original that has been read by the image reading section 101. The printer section 102 has multiple sheet feeding trays so as to enable selection of different paper sizes and different paper orientations, with paper cassettes 107, 108, and 109 corresponding to these. Furthermore, a discharge tray 106 is a component that receives papers on which printing has been completed.

Detailed Description of Controller

Figure 2:
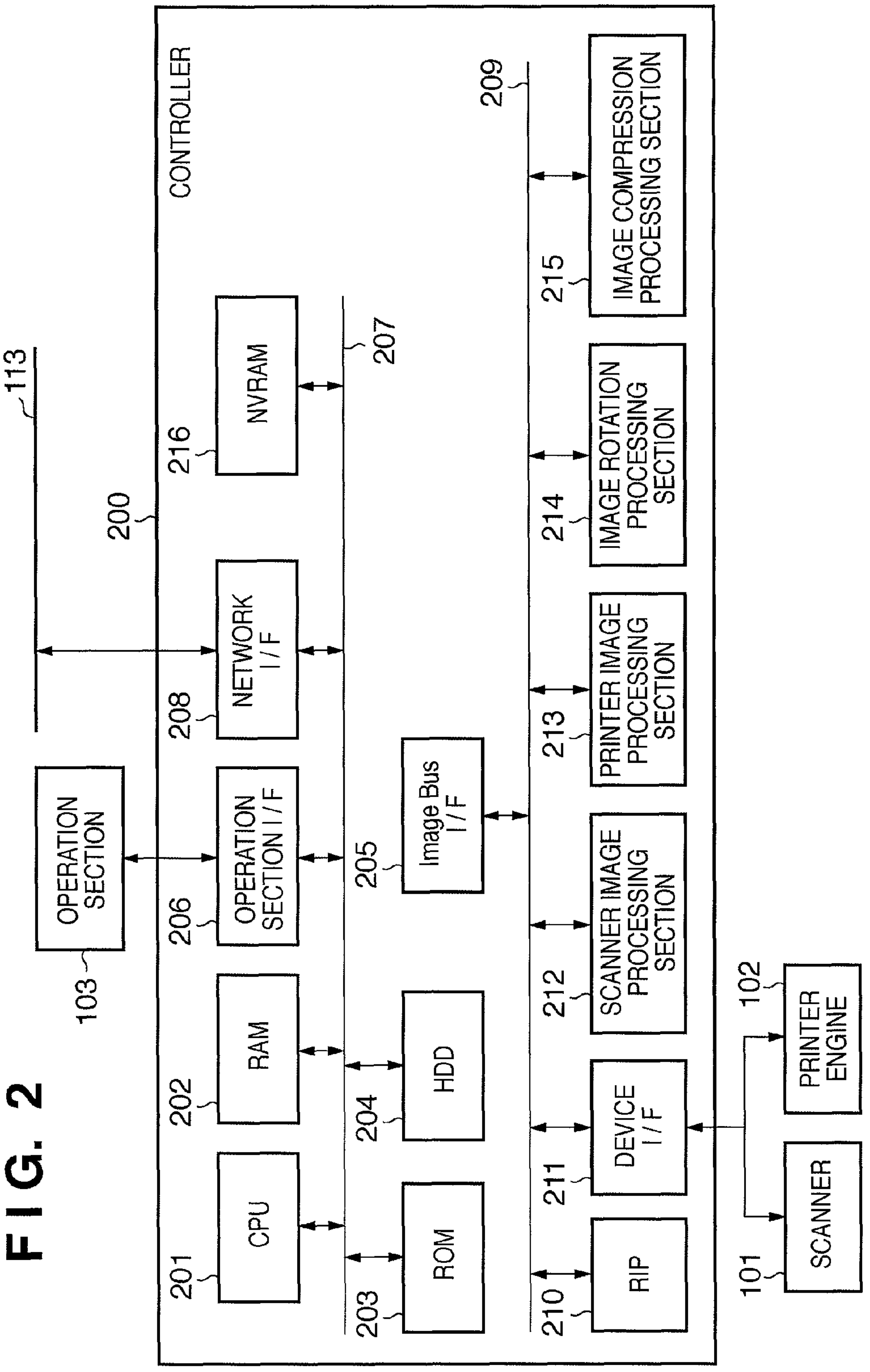
FIG. 2 is a block diagram showing a detailed configuration example of the controller in the MFP 1.

Next, detailed description is given using FIG. 2 of a configuration and operation of a controller that performs overall control of the MFP 1.

FIG. 2 is a block diagram showing a detailed configuration example of the controller in the MFP 1. In FIG. 2, a controller 200 is connected to the image reading section (scanner) 101 and the printer section (printer engine) 102 on the one hand, and is also connected to a LAN 113 via a network interface (I/F) 208. In this way, it is possible to carry out input and output of image data, image information, and device information and the like.

In the controller 200, a CPU 201 performs overall control of the system by transmitting control signals by which determinations and control of various processes are carried out in various processing sections in accordance with control programs stored in a ROM 203. A RAM 202 is used as a work area for the CPU 201 to carry out various controls and is also used as an image memory for temporarily storing image data.

A HDD 204 is a hard disk drive and is used for storing system software and image data. An operation section I/F 206 manages an interface between the controller 200 and the operation section 103, and serves a role in transmitting to the CPU 201 information that has been inputted by a user via the operation section 103. Furthermore, environment settings information such as operation modes inputted from the operation section 103 is stored in an NVRAM 216, which is a nonvolatile memory.

The network I/F 208 carries out input and output of information with respect to the LAN 113. The above-mentioned CPU 201, RAM 202, ROM 203, HDD 204, operation section I/F 206, network I/F 208, and NVRAM 216 are arranged on a system bus 207.

An image bus interface (image bus I/F) 205 is a bus bridge that connects the system bus 207 and an image bus 209, by which image data is transferred at high speeds, and performs data structure conversions. The image bus 209 is configured as a PCI bus or an IEEE 1394, and the following devices are arranged thereon.

A raster image processor (RIP) 210 develops PDL code sent from the network into a bitmap image. A device I/F section 211 connects the scanner 101 and the printer engine 102, which are image input/output devices, to the controller 200 and carries out conversions of image data of synchronous systems and asynchronous systems.

A scanner image processing section 212 carries out correction, processing, and editing on input data. A printer image processing section 213 carries out correction and resolution conversions and the like of the printer with respect to print output data. An image rotation processing section 214 carries out rotation of image data. An image compression processing section 215 carries out compression and decompression processing of JPEG for multi-value image data and JBIG, MMR, and MH, and the like for binary image data.

Scanner Image Processing Section

Figure 3:
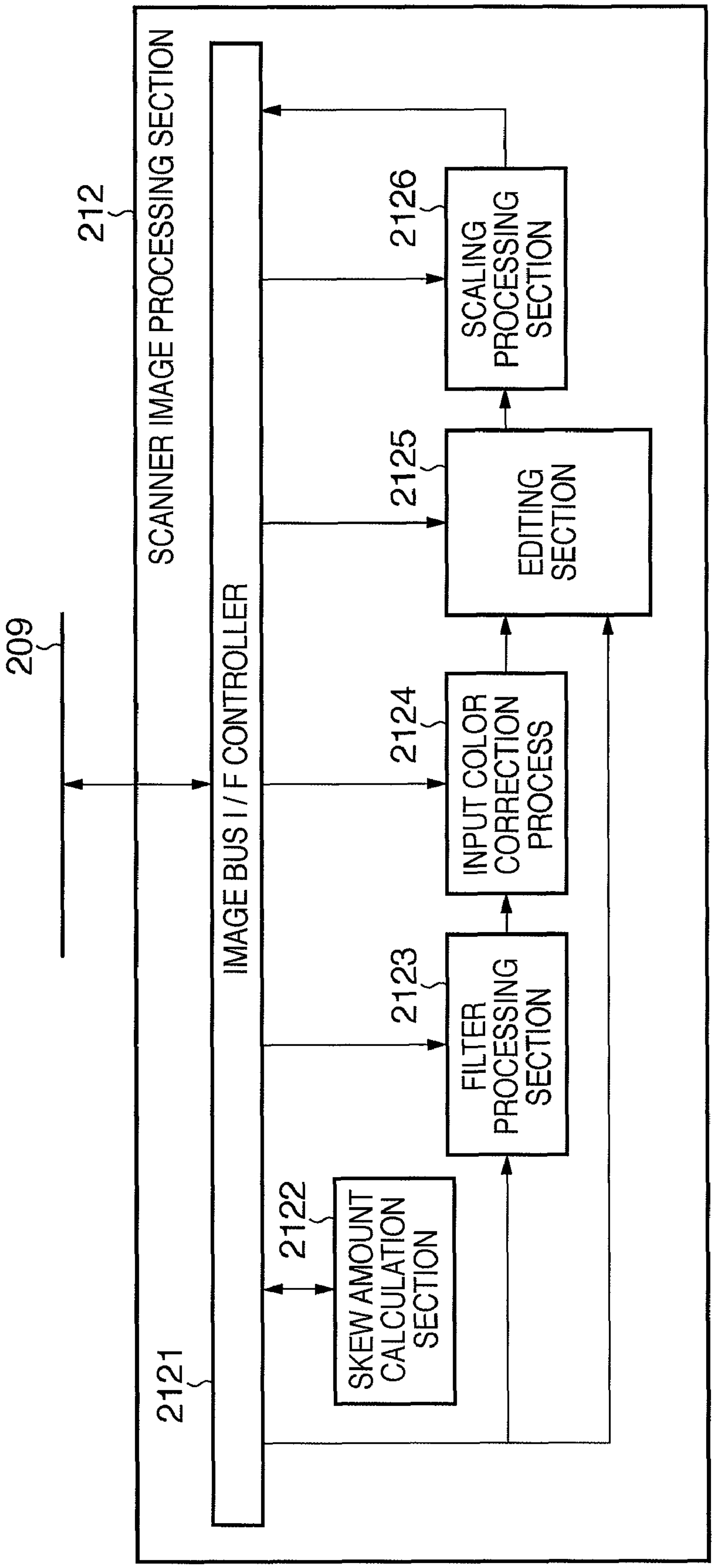
FIG. 3 is a block diagram showing a detailed configuration example of a scanner image processing section 212 in the MFP 1.

Next, detailed description is given using FIG. 2 and FIG. 3 of a configuration and operation of the scanner image processing section 212 in the controller 200.

FIG. 3 is a block diagram showing a detailed configuration example of the scanner image processing section 212 in the MFP 1. In FIG. 3, numeral 2121 indicates an image bus I/F controller that is connected to the image bus 209 and works to control the bus access sequence thereof and controls the various devices in the scanner image processing section 212 and produces timings thereof. Numeral 2122 indicates a skew amount calculation section that calculates a skew amount of an original that has been read by the scanner 101. Numeral 2123 indicates a filter processing section that carries out convolution calculations using a space filter.

Numeral 2124 indicates an input color correction process in which a process of converting image data that has been read to an appropriate color space is carried out using a 3D LUT. Numeral 2125 indicates an editing section in which, for example, a closed area enclosed by a marker pen from the inputted image data is recognized and processing of image processes such as shadowing, screening, and negative/positive inversion is carried out on the image data inside the closed area. Numeral 2126 indicates a scaling processing section that carries out enlargement or reduction processing by carrying out interpolation calculations in a main scanning direction of the raster image in the case where the resolution of the image that has been read is to be changed. In regard to sub-scanning direction scaling, this is carried out by varying the scanning speed of an image reading line sensor (not shown in diagrams).

Printer Image Processing Section

Figure 4:
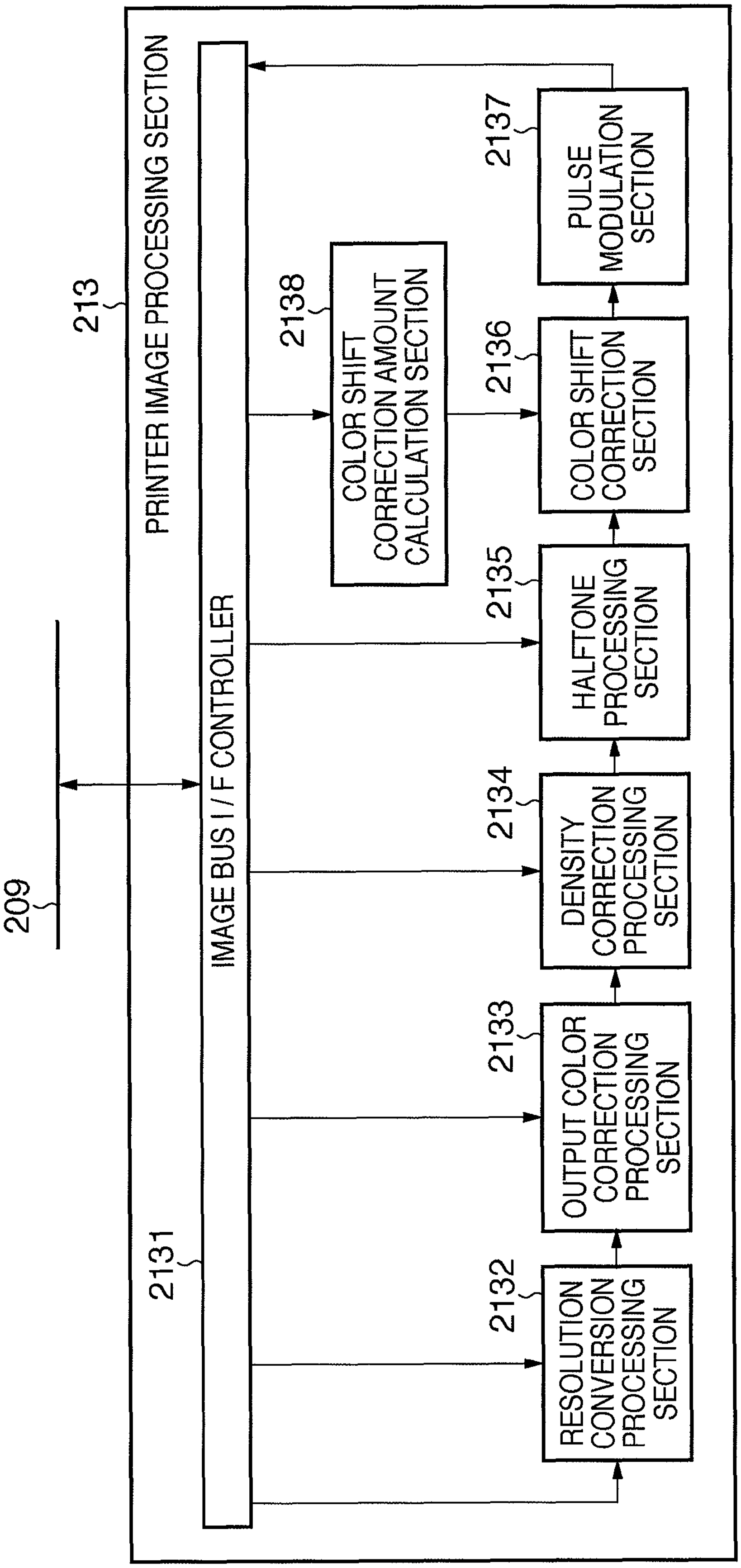
FIG. 4 is a block diagram showing a detailed configuration example of a printer image processing section 213 in the MFP 1.

Next, detailed description is given using FIG. 2 and FIG. 4 of a configuration and operation of the printer image processing section 213 in the controller 200.

FIG. 4 is a block diagram showing a detailed configuration example of the printer image processing section 213 in the MFP 1. In FIG. 4, numeral 2131 indicates an image bus I/F controller that is connected to the image bus 209 and works to control the bus access sequence thereof and controls the various devices in the printer image processing section 213 and produces timings thereof. Numeral 2132 indicates a resolution conversion processing section that carries out a process of converting image data, which has been inputted from the scanner 101 or the LAN 113, to a resolution of the printer engine 102. Numeral 2133 indicates an output color correction processing section that uses a 3D LUT matched to characteristics of the printer engine to carry out interpolation calculation processing on the image data of the resolution converted by the resolution conversion processing section 2132, and converts this to CMYK format printing information.

Numeral 2134 indicates a density correction processing section that carries out a process using a density correction table such that linearity is preserved in the density characteristics. Numeral 2135 indicates a halftone processing section that converts multi-value output image data to a predetermined number of gradations using an error-diffusion process or a screening process. Numeral 2136 indicates a color shift correction section that corrects color shift caused by tilting and curvature in scanning lines based on a calculation result of a color shift correction amount calculation section 2138. Details of the color shift correction processing in the color shift correction section 2136 are described later.

Numeral 2137 indicates a pulse modulation section that performs conversion into exposure times that can be inputted to the printer engine 102. Numeral 2138 indicates the color shift correction amount calculation section that calculates correction amounts to offset the overall color shift amounts from the color shift amounts of the printer engine 102 and the skew amounts calculated by the skew amount calculation section 2122 of the scanner image processing section 212, which are described later.

Image Rotation Processing Section

Figure 5:
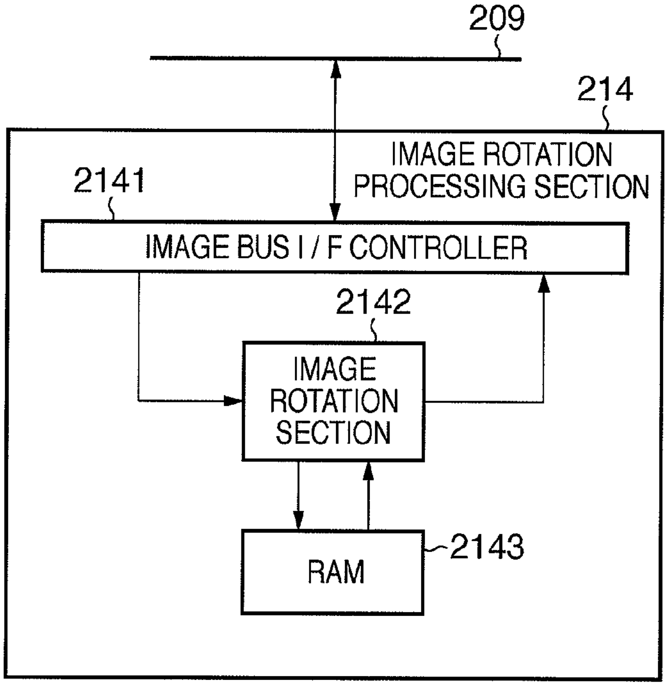
FIG. 5 is a block diagram showing a detailed configuration example of an image rotation processing section 214 in the MFP 1.

Next, detailed description is given using FIG. 2 and FIG. 5 of a configuration and operation of the image rotation processing section 214 in the controller 200.

FIG. 5 is a block diagram showing a detailed configuration example of the image rotation processing section 214 in the MFP 1. In FIG. 5, numeral 2141 indicates an image bus I/F controller that is connected to the image bus 209 and works to control the bus access sequence thereof and carries out control in which modes or the like are set in the image rotation processing section 214. Furthermore, it carries out timing control for transferring image data to the image rotation processing section 214. Numeral 2142 indicates an image rotation section that writes to a RAM 2143 in accordance with settings such as image size, rotation direction, and angle, which are set using the image bus I/F controller 2141.

Image Compression Processing Section

Figure 6:
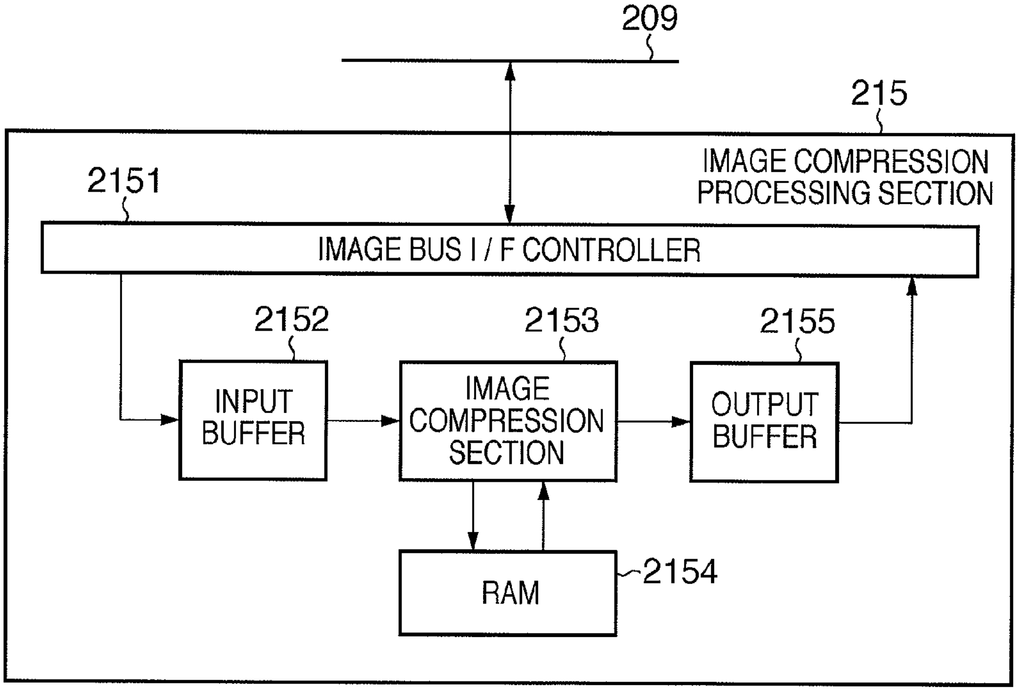
FIG. 6 is a block diagram showing a detailed configuration example of an image compression processing section 215 in the MFP 1.

Next, detailed description is given using FIG. 2 and FIG. 6 of a configuration and operation of the image compression processing section 215 in the controller 200.

FIG. 6 is a block diagram showing a detailed configuration example of the image compression processing section 215 in the MFP 1. In FIG. 6, numeral 2151 indicates an image bus I/F controller that is connected to the image bus 209 and works to control the bus access sequence thereof, carries out timing control for carrying out exchanges of data between an input buffer 2152 and an output buffer 2155. Furthermore, it carries out control of mode settings and the like for an image compression section 2153. Numeral 2153 indicates the image compression section 2153 that writes compressed data to a RAM 2154 in accordance with settings such as MMR compression and JBIG expansion, which are set using the image bus I/F controller 2151.

Image Forming Section

Figure 7:
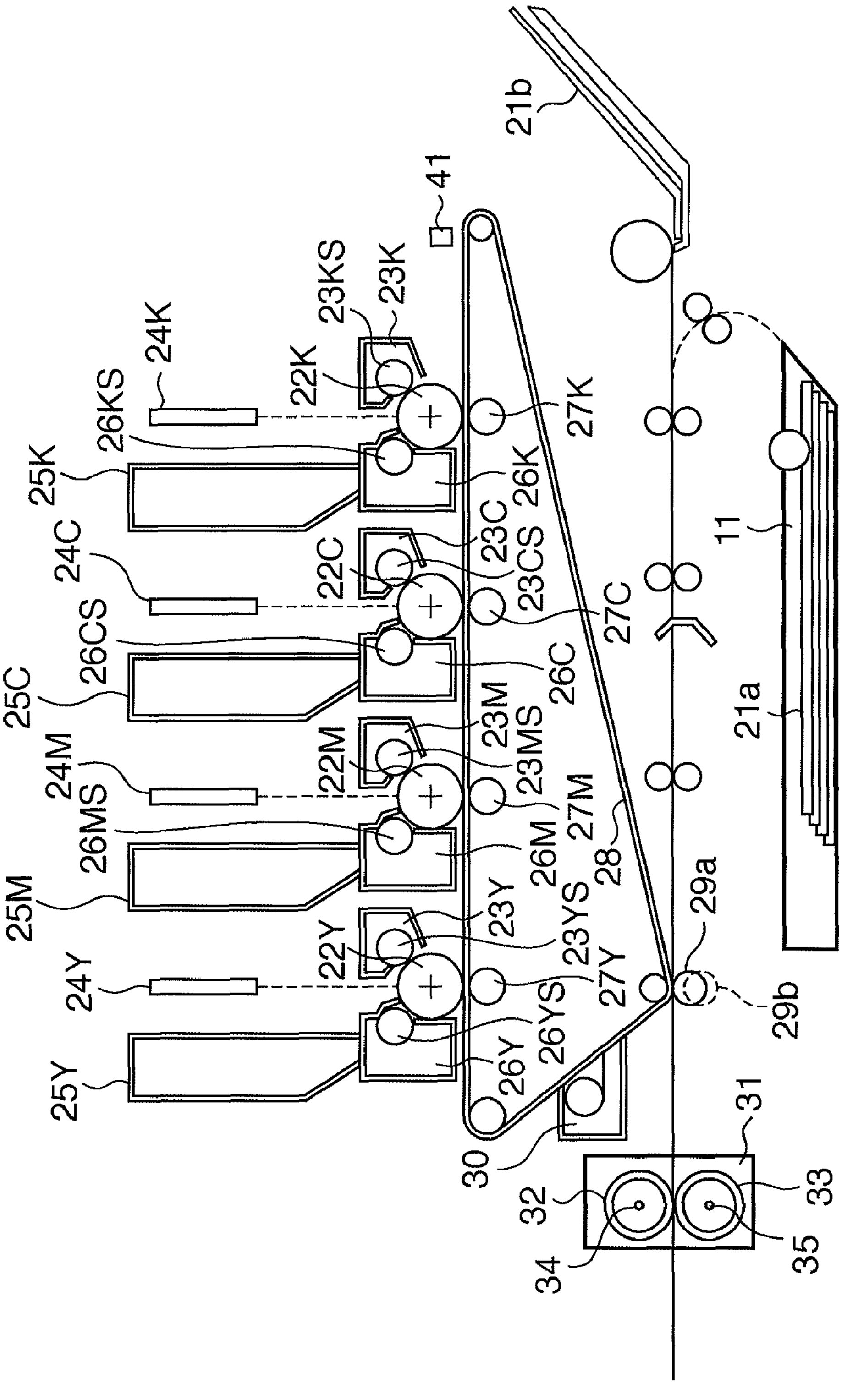
FIG. 7 is a diagram showing a configuration of an image forming section of a printer section (printer engine) 102.

Next, detailed description is given using FIG. 7 of a configuration and operation of an image forming section of the printer section (printer engine) 102. Here, description is given using as an example a tandem method color image forming apparatus employing an intermediate transfer member 28, which is one example of an electrophotographic method color image forming apparatus.

FIG. 7 is a diagram showing a configuration of an image forming section of the printer section (printer engine) 102. In FIG. 7, each of the image forming sections drives exposure light in accordance with exposure signals outputted from the printer image processing section 213 to form an electrostatic latent image, and each of these electrostatic latent images is developed to form a single color toner image. Then, these single color toner images are superimposed to form a multicolor toner image, and after the thus-formed multicolor toner image is transferred to a recording medium 11, the multicolor toner image is fixed onto the recording medium 11.

A charging unit is provided with four injection chargers 23Y, 23M, 23C, and 23K for charging photosensitive members 22Y, 22M, 22C, and 22K in each of the stations of yellow (Y), magenta (M), cyan (C), and black (K). Sleeves 23YS, 23MS, 23CS, and 23KS are provided at the injection chargers 23Y, 23M, 23C, and 23K.

The photosensitive members 22Y, 22M, 22C, and 22K are configured by coating an organic photoconductive layer onto an outer circumference of an aluminum cylinder and are rotatable due to the transmission of a driving force of an unshown drive motor. The drive motor can cause the photosensitive members 22Y, 22M, 22C, and 22K to be rotated in a counterclockwise direction in response to an image forming operation.

An exposure unit is configured to irradiate exposure light from scanner sections 24Y, 24M, 24C, and 24K to the photosensitive members 22Y, 22M, 22C, and 22K and to form electrostatic latent images by selectively exposing the surfaces of the photosensitive members 22Y, 22M, 22C, and 22K.

A developer unit is a configuration provided with four developing devices 26Y, 26M, 26C, and 26K that carry out development of yellow (Y), magenta (M), cyan (C), and black (K) in each of the stations for making visible the electrostatic latent images. And sleeves 26YS, 26MS, 26CS, and 26KS are provided at the developing devices 26Y, 26M, 26C, and 26K. It should be noted that each of the developing devices 26Y, 26M, 26C, and 26K can be attached and detached.

A transfer unit causes the intermediate transfer member 28 to rotate in a clockwise direction to transfer each of the single color toner images from the photosensitive members 22 to the intermediate transfer member 28. And the single color toner images are transferred accompanying the rotation of the photosensitive members 22Y, 22M, 22C, and 22K and primary transfer rollers 27Y, 27M, 27C, and 27K positioned in opposition to the photosensitive members.

By applying an appropriate bias voltage to the primary transfer rollers 27 and by ensuring a gap between the rotation velocity of the photosensitive members 22 and the rotation velocity of the intermediate transfer member 28, excellent efficiency can be achieved in transferring (primary transfer) the single color toner images to the intermediate transfer member 28.

Further still, the transfer unit superimposes the single color toner image at each station onto the intermediate transfer member 28 and transports the thus-superimposed multicolor toner image to a secondary transfer roller 29 accompanying rotation of the intermediate transfer member 28. Then it sandwiches and transports the recording medium 11 from a paper supply tray 21 (a or b) to the secondary transfer roller 29 and transfers the multicolor toner image on the intermediate transfer member 28 onto the recording medium 11. An appropriate bias voltage is applied to the secondary transfer roller 29 to transfer the toner image electrostatically (secondary transfer). The secondary transfer roller 29 contacts the recording medium 11 at a position of 29*a* while the multicolor toner image is being transferred onto the recording medium 11, and moves apart to a position of 29*b* after processing.

In order to melt and fix to the recording medium 11 the multicolor toner image that has been transferred to the recording medium 11, a fixing unit is provided with a fixing roller 32 that heats the recording medium 11 and a pressure roller 33 for pressing the recording medium 11 against the fixing roller 32. The fixing roller 32 and the pressure roller 33 are formed hollow and heaters 34 and 35 are installed therein respectively. A fixing device 31 uses the fixing roller 32 and the pressure roller 33 to transport the recording medium 11 that is carrying the multicolor toner image and fixes the toner to the recording medium 11 by applying heat and pressure.

After the fixing of the toner, the recording medium 11 is subsequently discharged to an unshown discharge tray by an unshown discharge roller, thereby completing the image forming operation.

A cleaning unit 30 performs cleaning on the toner remaining on the intermediate transfer member 28, and waste toner that remains after the 4-color toner image formed on the intermediate transfer member 28 has been transferred to the recording medium 11 is accumulated in a cleaner container.

A color shift detection sensor 41 is arranged in a position facing toward the intermediate transfer member 28. A color shift detection patch is formed on the intermediate transfer member 28, which enables a color shift amount of each color to be determined from the detection timings of the patch.

Figure 8:
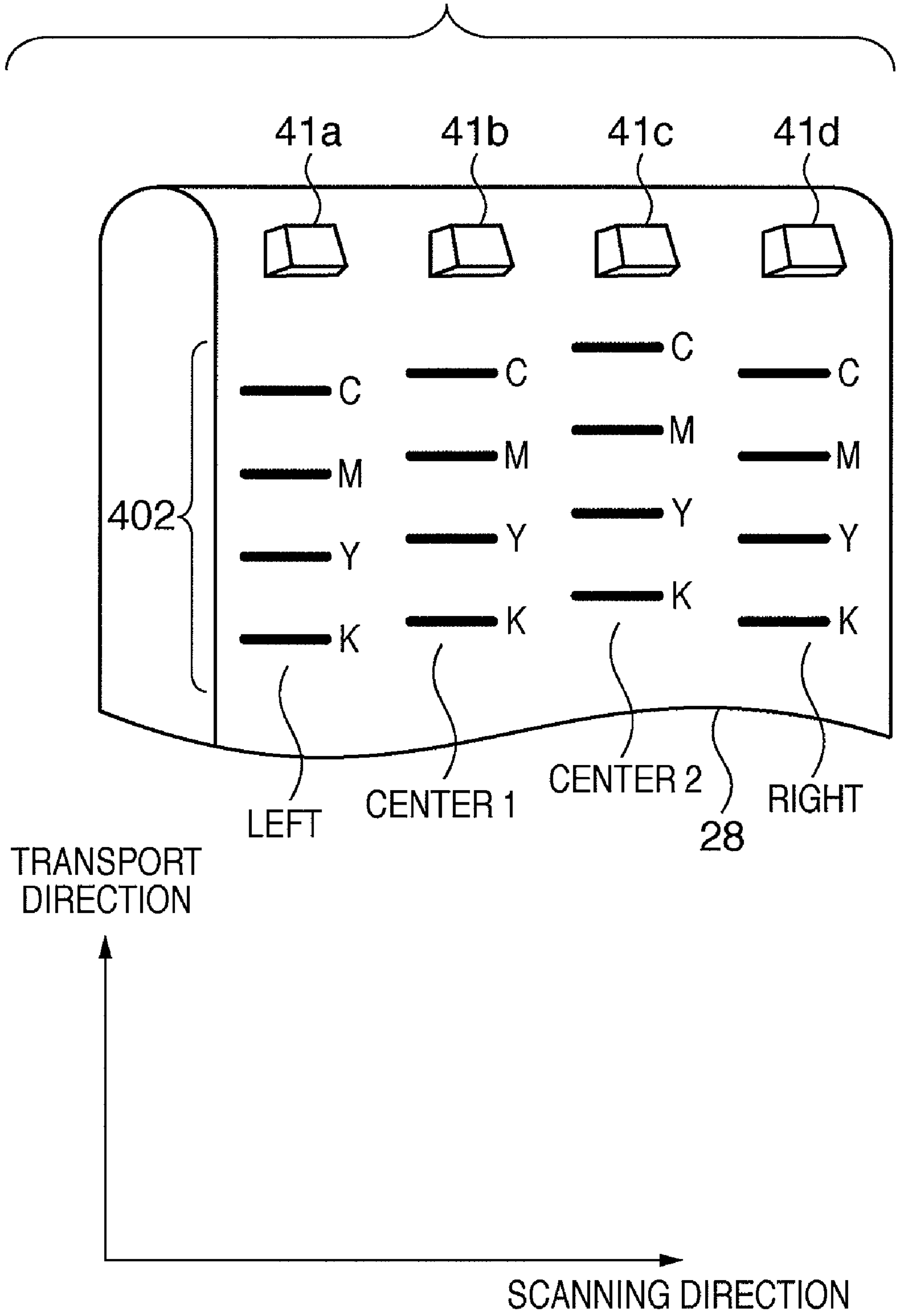
FIG. 8 is diagram showing one example of a color shift detection method using a color shift detection sensor 41.

Here, description is given using FIG. 8 of a specific example of a color shift detection method in which color shift is detected by the color shift detection sensor 41.

FIG. 8 is diagram showing one example of a color shift detection method using the color shift detection sensor 41. Four color shift detection sensors 41*a*, 41*b*, 41*c*, and 41*d* are provided in a scanning direction above the intermediate transfer member 28. The intermediate transfer member 28 is moved in a transport direction and a color shift detection patch 402 of each of the colors CMYK formed on the intermediate transfer member 28 passes below each of the sensors. Here, each of the detection sensors 41 is configured to be capable of detecting the color shift detection patch 402 of each color that passes therebelow.

As shown in FIG. 8, the detection sensors 41 detect color shift at four locations in the scanning direction, namely left, center 1, center 2, and right, thereby making it possible to obtain a magnitude of tilting and curvature of the scanning lines under the control of an unshown CPU. Depending on the configuration of the apparatus, there are color image forming apparatuses provided with color shift detection sensors 41 for only the two locations of left and right, and in this case, only the magnitude of tilting can be obtained.

Figure 9:
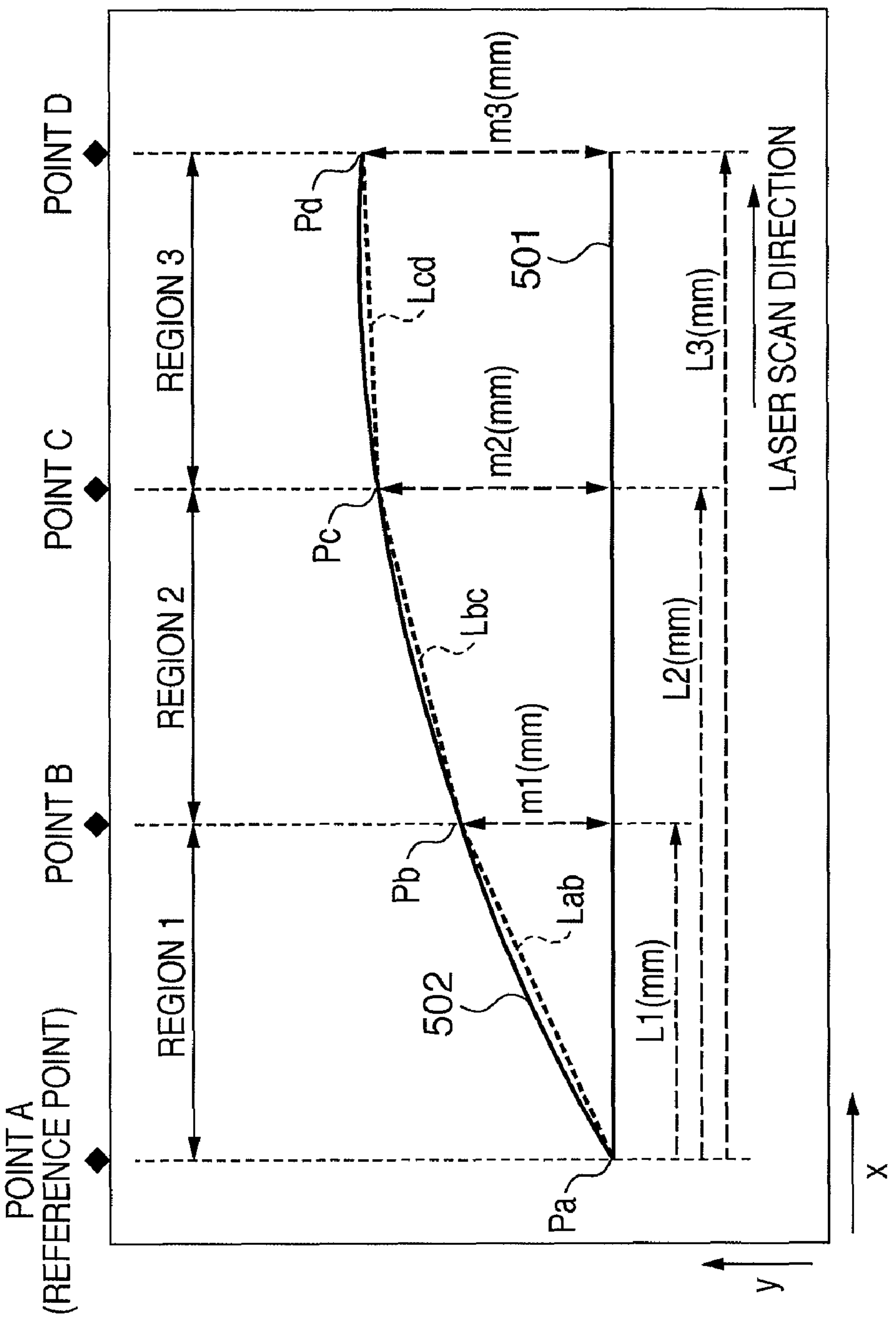
FIG. 9 is a diagram for describing correction of color shift for main scanning lines.

FIG. 9 is a diagram for describing correction of color shift for main scanning lines. Numeral 501 shown in FIG. 9 indicates an ideal scanning line in which scanning is carried out perpendicular to the rotation direction of the photosensitive member 22. Furthermore, numeral 502 indicates an actual scanning line in which tilting and curvature has occurred, originating in shifts of the positional accuracy or diameter of the photosensitive member 22 and the positional accuracy of the optical system in the scanner section 24 of each color.

Since the magnitude of tilting and curvature of the scanning lines varies in each of the C, M, Y, and K image stations in this manner, color shift is produced in the toner image that is formed by toner images of all colors being transferred onto the intermediate transfer member 28. Here, a main scanning direction (x direction) corresponds to a laser scan direction and a sub-scanning direction (y direction) corresponds to the transport direction of the recording medium.

A point A, which is a scanning commencement position of the image formation region, is set as a reference point (Pa). Shift amounts (m1, m2, and m3) in the sub-scanning direction (y direction) between the ideal scanning line 501 and the actual scanning line 502 are measured at a plurality of points (B, C, and D) dividing the scanning line in the main scanning direction, and the corresponding points on the scanning line 502 are set as Pb, Pc, and Peripheral direction.

The main scanning direction (x direction) is divided into a region 1 (between the points Pa and Pb), a region 2 (between the points Pb and Pc), and a region 3 (between the points Pc and Pd), and straight lines connecting between these points are set as Lab, Lbc, and Lcd. An increment of the shift amount in the sub-scanning direction (y direction) in region 1 is m1, an increment of the shift amount in region 2 is m2−m1, and an increment of the shift amount in the region 2 is m3−m2.

Accordingly, when region lengths of the regions are L1, L2, and L3 respectively, the tilting of the straight lines Lab, Lbc, and Lcd can be obtained from the increment of each region and the region length.

Furthermore, when the increment of the shift amount is a positive value, the scanning line in the corresponding region shows an upward-sloping tilt (+) and when the increment of the shift amount is a negative value, the scanning line in the corresponding region shows a downward-sloping tilt (−).

Image Formation Processing Section

Figure 10:
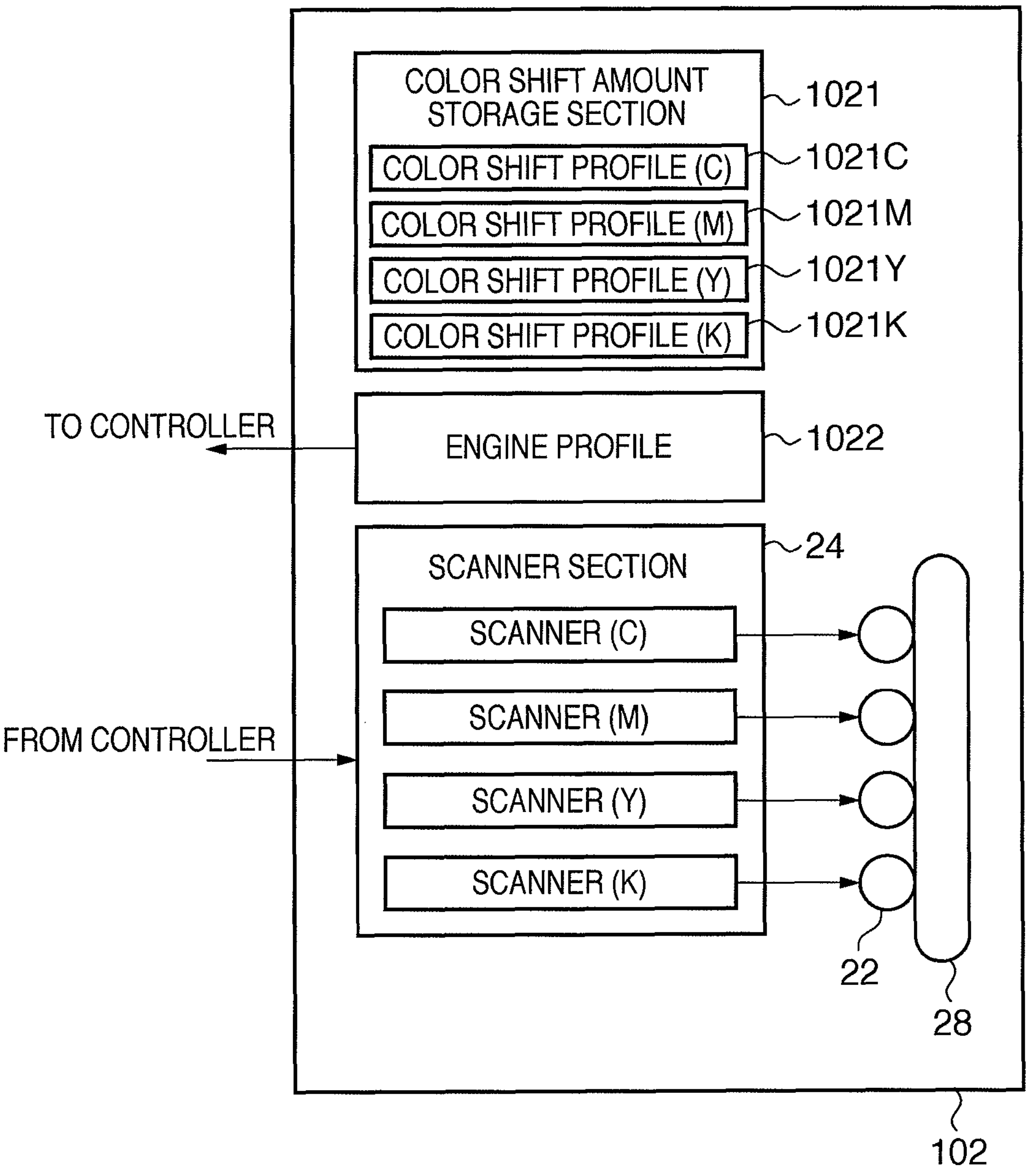
FIG. 10 is a block diagram showing a detailed configuration example of an image formation processing section installed in the printer engine 102.

Next, description is given using FIG. 10 and FIG. 11 of a configuration and operation of an image formation processing section in the printer engine 102 in which the abovementioned color shift detection method is executed.

FIG. 10 is a block diagram showing a detailed configuration example of an image formation processing section installed in the printer engine 102. In FIG. 10, numeral 1021 indicates a color shift amount storage section that stores color shift profile information 1021C, 1021M, 1021Y, and 1021K of the regions for each color (region 1, region 2, and region 3 shown in FIG. 9). Color shift profile information indicates shift amounts in the sub-scanning direction between the actual main scanning line 502 and the ideal scanning line 501 measured at a plurality of points (B, C, and D).

FIG. 11 is diagram showing one example of color shift profile information stored in the color shift amount storage section 1021. It should be noted that the form of the profiles is not limited to this and it is sufficient that characteristics of the tilting and curvature of the scanning lines are shown.

Here, several methods are conceivable as methods for obtaining color shift profile information to be stored in the color shift amount storage section 1021. For example, a method is possible of obtaining the tilting from a result of detecting the color shift detection patch 402 formed on the intermediate transfer member 28 using the aforementioned color shift detection sensors 41*a*, 41*b*, 41*c*, and 41*d*. Furthermore, a method is possible of obtaining profile information by measuring the shift amounts in a manufacturing step of the image forming apparatus. Further still, other methods are possible such as using the image forming apparatus to output a color shift measurement chart that has been prepared in advance, then reading the output image using an image scanner or the like to produce electrical information, and obtaining profile information from that electrical information.

Numeral 1022 shown in FIG. 10 indicates an engine profile, which is constituted by information of an offset amount from a reference point corresponding to the paper size, scanning direction information of the beam for each color, and a recording medium transport velocity. For example, in the case where the scanning direction varies, it is necessary to assign a symbol to the correction amount in accordance with the scanning direction. For example, with the engine profile information 1022, the color shift correction amount calculation section 2138 calculates correction amounts by setting the symbol to negative when the scanning direction is forward and setting the symbol to positive when it is reverse.

First Embodiment

Figure 12:
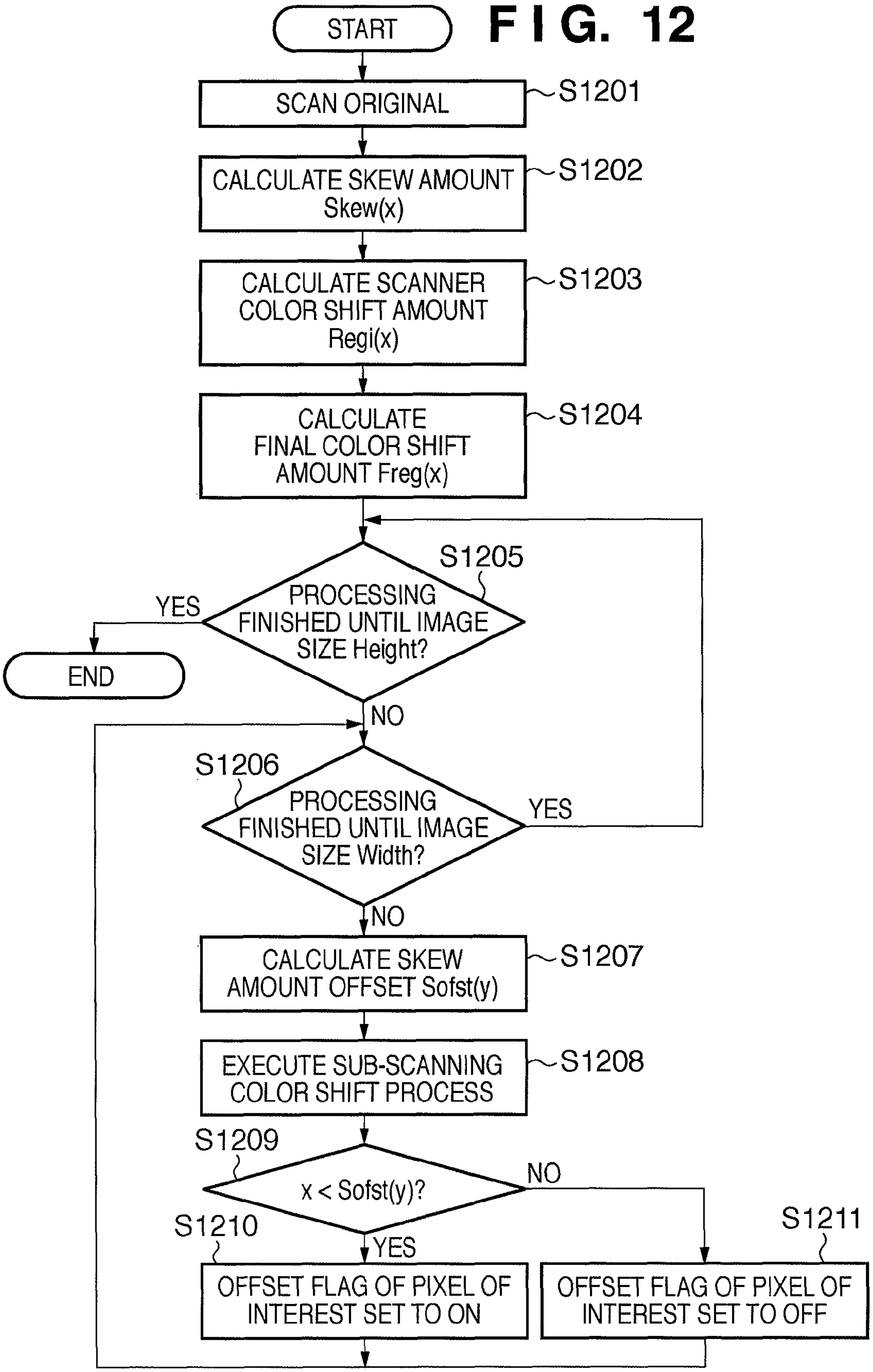
FIG. 12 is a flowchart showing a color shift correction process according to a first embodiment.

Here, description is given using FIG. 12 of details of the color shift correction processing executed by the skew amount calculation section 2122, the color shift correction section 2136, and the color shift correction amount calculation section 2138.

Figure 13A:
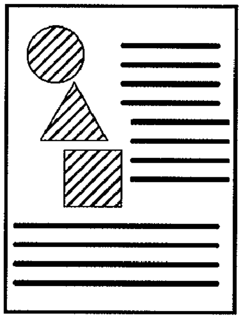
FIG. 13A is a diagram showing one example of an original to be read by a scanner.
Figure 13B:
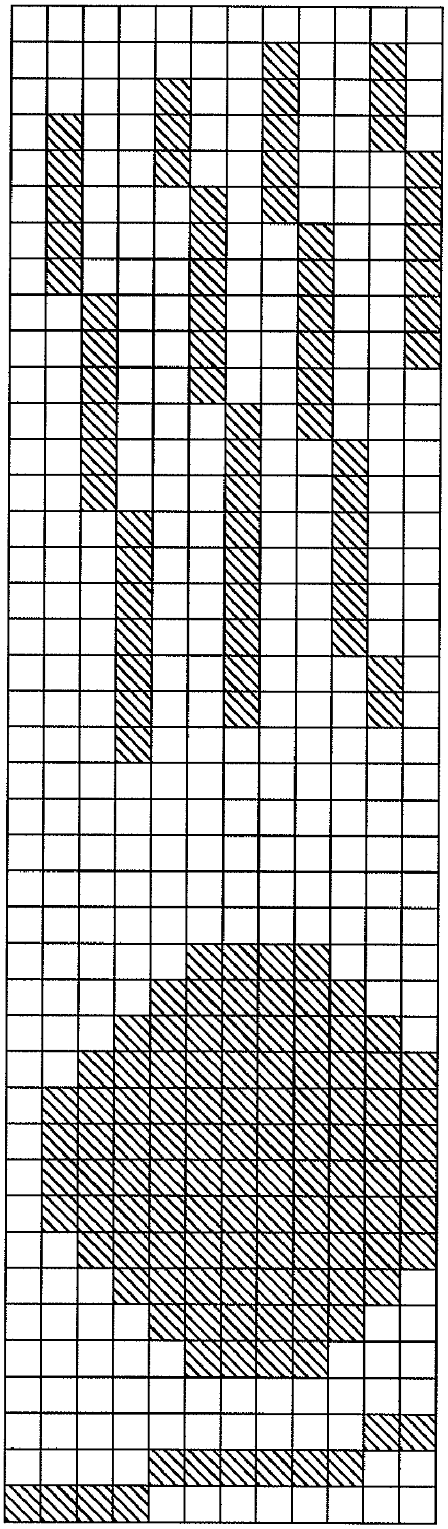
FIG. 13B is a diagram showing a bitmap image of the original that has been read.

FIG. 12 is a flowchart showing a color shift correction process according to a first embodiment. First, at step S1201, the scanner 101 scans an image shown in FIG. 13A to a bitmap image such as that shown in FIG. 13B. Then, at step S1202, the skew amount calculation section 2122 calculates a skew amount Skew (x) of the original.

Figure 13C:
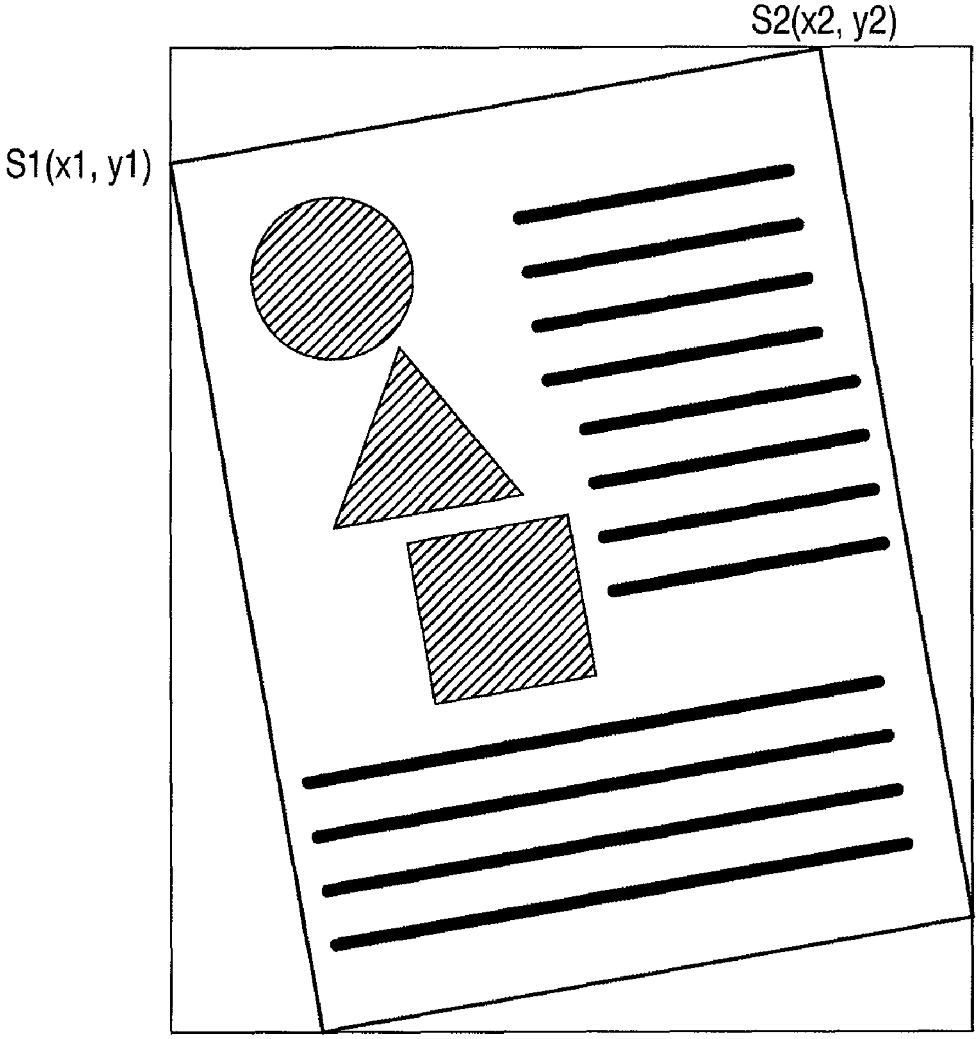
FIG. 13C is a diagram showing image data of a skewed original that has been read.

Here, when upper left coordinates of the original to be read by the scanner 101 are set as S1 (x1, y1) and upper right coordinates are set as S2 (x2, y2) as shown in FIG. 13C, the skew amount Skew (x) is obtained by the following formula 1.

$$\text{Skew}(X) = \frac{y2 - y1}{x2 - x1} \times X \quad \text{Formula 1}$$

Figure 13D:
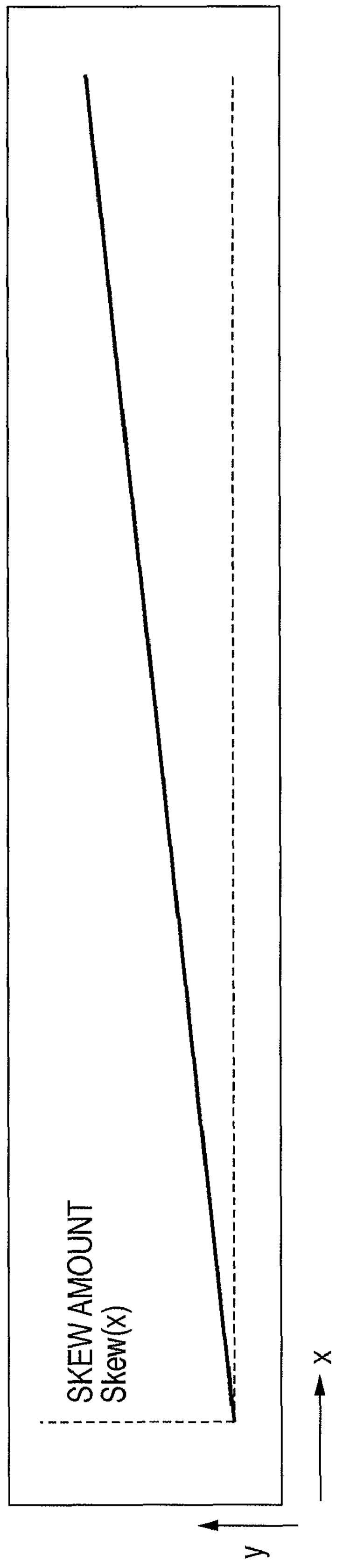
FIG. 13D is a diagram showing a skew amount per single sub-scanning line.

With the above formula 1, the skew amount per single sub-scanning line can be calculated as shown in FIG. 13D.

Figure 14:
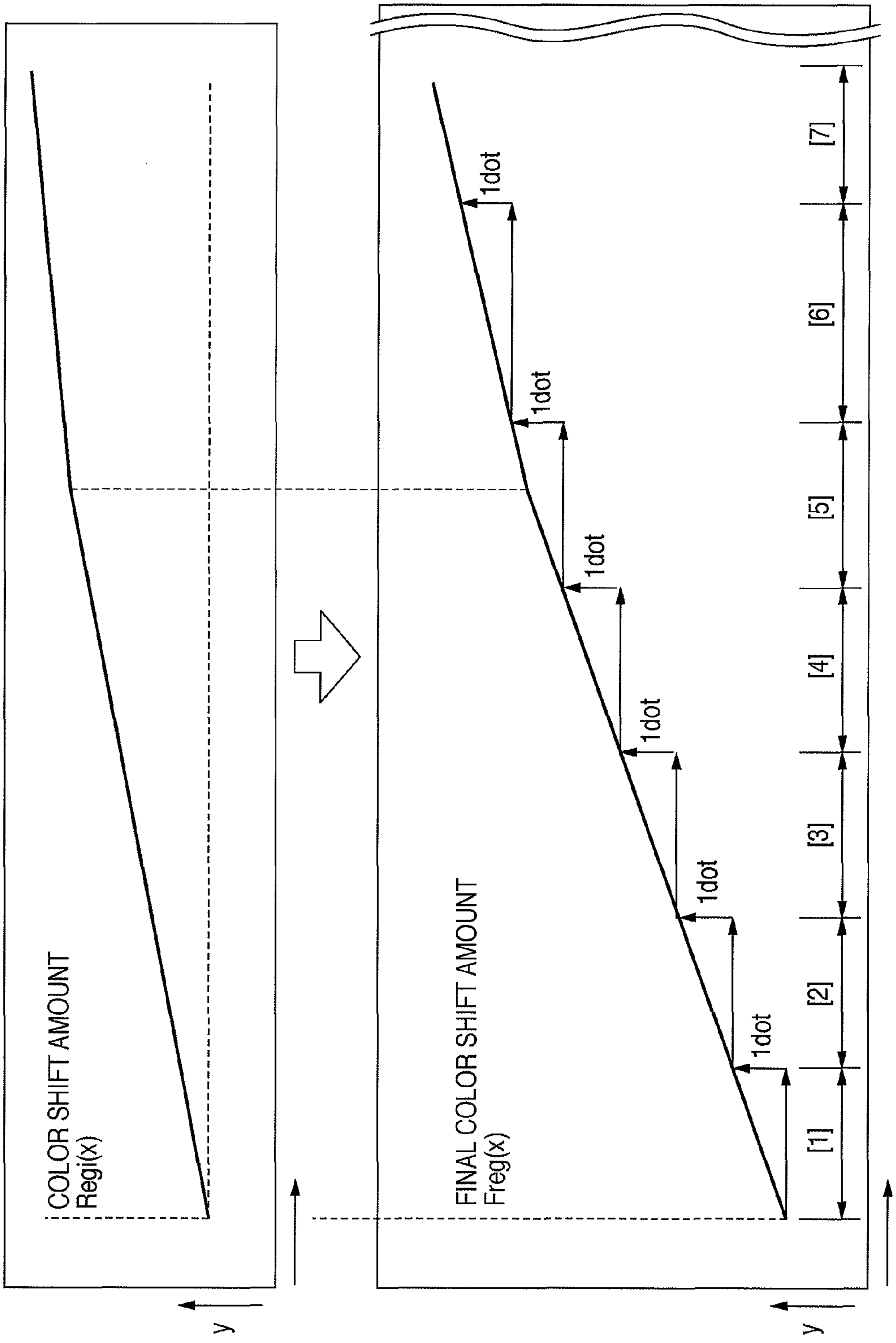
FIG. 14 is a diagram showing a scanner color shift amount Regi(x) and a final color shift amount.

Next, at step S1203, color shift profile information for each color stored in the color shift amount storage section 1021 is obtained, and a color shift amount Regi(x) shown in FIG. 14 is calculated. Here, when main scanning direction coordinates data is set as xdot and sub-scanning direction color shift correction amounts are set as Δydot, then color shift correction amounts Δy in each of the regions 1, 2, and 3 shown in FIG. 9 can be obtained by the following arithmetic formula. It should be noted that the image formation resolution is set as r(dpi).

$$\text{Region 1: } \Delta y1 = x\left(\frac{m1}{L1}\right) \quad \text{Formula 2-1}$$

$$\text{Region 2: } \Delta y2 = \frac{m1}{r} + \left(x - \left(\frac{L1}{r}\right)\right) \times \left(\frac{m2 - m1}{L2 - L1}\right) \quad \text{Formula 2-2}$$

$$\text{Region 3: } \Delta y3 = \frac{m2}{r} + \left(x - \left(\frac{L2}{r}\right)\right) \times \left(\frac{m3 - m2}{L3 - L2}\right) \quad \text{Formula 2-3}$$

L1, L2, and L3 indicate region lengths (in units of mm) of the region 1, region 2, and region 3, and m1, m2, and m3 indicate shift amounts between the ideal scanning line 501 and the actual scanning line 502 at right edge points (Pb, Pc, and Pd) of the region 1, region 2, and region 3.

Next, at step S1204, a final color shift amount Freg(x) of (b) shown in FIG. 14 is calculated from the skew amount Skew(x) calculated at step S1202 and the color shift amount Regi(x) calculated at step S1203. The final color shift amount Freg(x) is calculated by the following formula 3.

$$\text{Freg}(x) = \text{Regi}(x) + \text{Skew}(x) \quad \text{Formula 3}$$

Next, at step S1205, a determination is performed as to whether or not processing is finished of all the scanning lines (corresponding to the image size height). When a result of the determination is that processing is not finished for all the scanning lines, the procedure proceeds to step S1206 and a determination is performed as to whether or not processing is finished of all the regions (corresponding to the image size width). When a result of the determination is that processing is not finished for all the regions, the procedure proceeds to step S1207 and a skew amount offset Sofst(y) is calculated. The skew amount offset Sofst(y) is for detecting a main scanning direction rendering position corresponding to the skew amount of the original image, and is calculated using the following formula.

$$\text{Sofst}(y) = \text{Skew}(y) \quad \text{Formula 4}$$

Next, at step S1208, a sub-scanning color shift process is executed by the color shift correction section 2136 in accordance with the final color shift amount Freg(x) calculated at step S1204. Then, at step S1209, a determination is performed as to whether or not a pixel of interest coordinate x corrected at step S1208 is larger than the skew amount offset Sofst(y). When a result of the determination is that the pixel of interest coordinate x is smaller than the skew amount offset Sofst(y), then the procedure proceeds to step S1210, and the pixel of interest is judged to be a pixel without a skewed object and an offset flag is set to ON.

On the other hand, at step S1209, when the pixel of interest coordinate x is not smaller than the skew amount offset Sofst (y), then the procedure proceeds to step S1211, and the pixel of interest is judged to be a pixel in which an object to be rendered is present and the offset flag is set to OFF.

Furthermore, when the result of the determination at step S1206 is that processing is finished for all the regions, the procedure returns to step S1205. On the other hand, when the result of the determination at step S1205 is that processing is finished for all the scanning lines, the procedure finishes.

Figure 15:
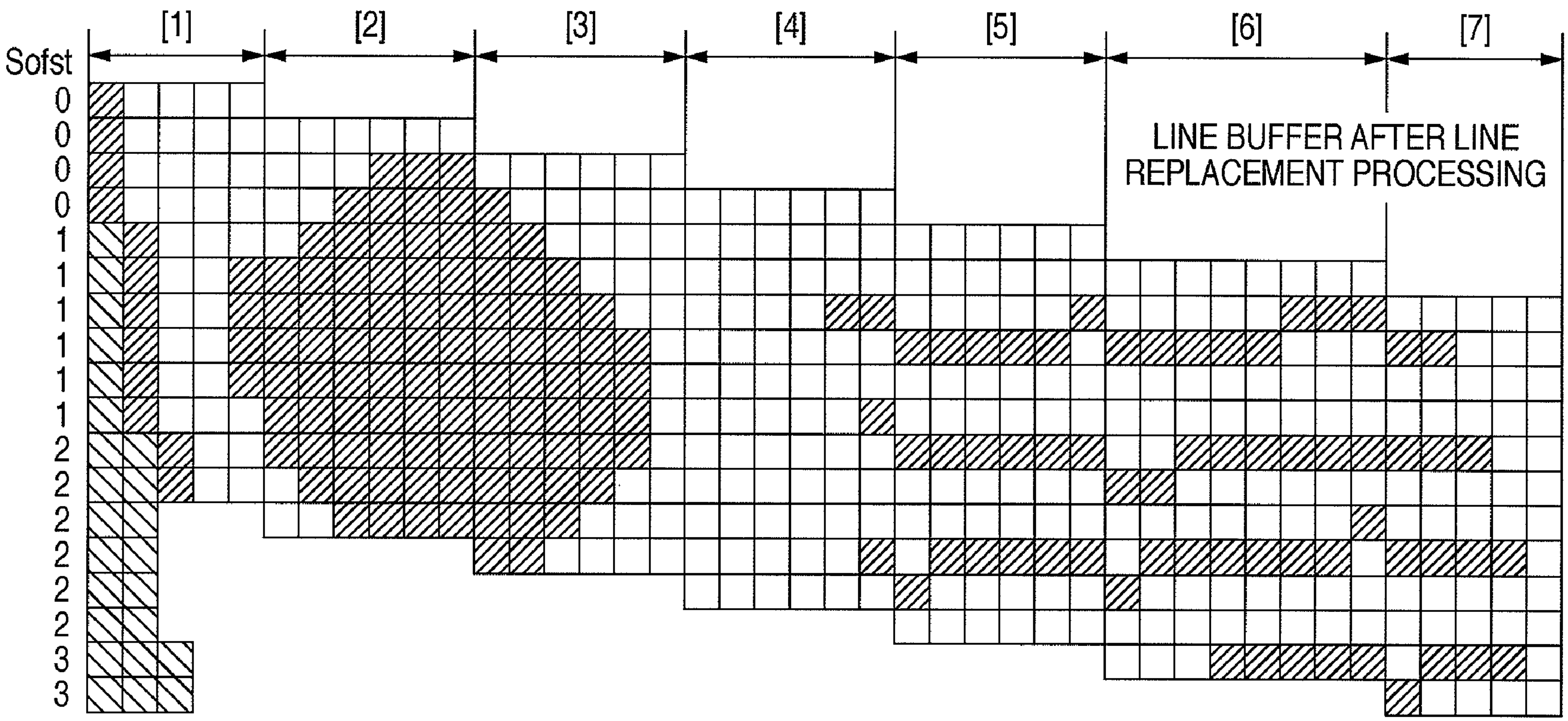
FIG. 15 is a diagram showing a bitmap image in which color shift correction processing has been executed.

FIG. 15 is a diagram showing a bitmap image in which color shift correction processing has been executed. Pixels shown as gray in FIG. 15 are pixels in which the offset flag has been set to ON. Furthermore, the values listed on the left side in FIG. 15 are the skew amount offsets Sofst(y) for each sub-scanning line.

Color Shift Correction Section

Figure 16:
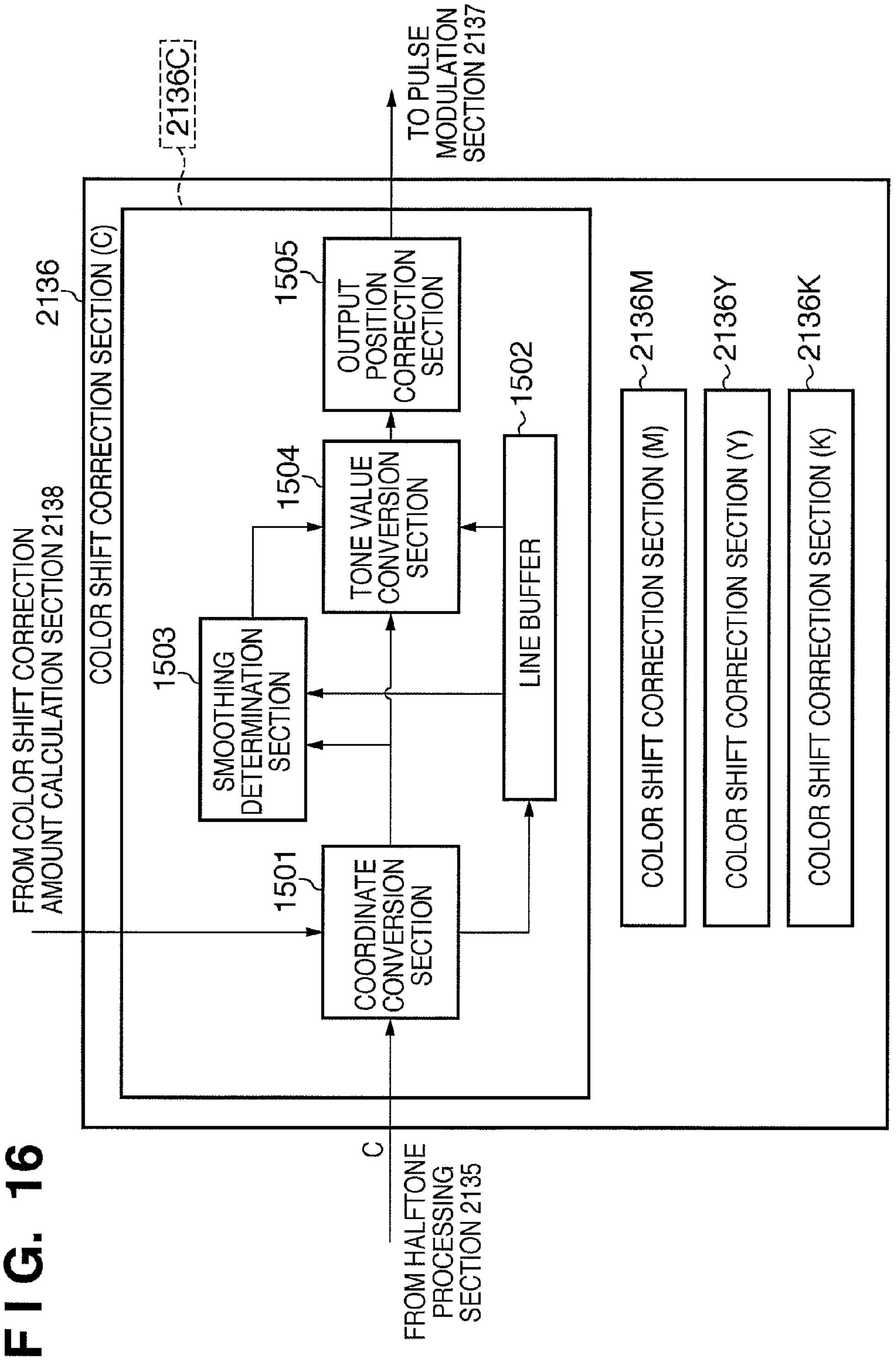
FIG. 16 is a block diagram showing a detailed configuration of a color shift correction section 2136.

Next, description is given using FIG. 16 of a detailed configuration of the color shift correction section 2136.

FIG. 16 is a block diagram showing a detailed configuration of the color shift correction section 2136. Color shift corrections are carried out in color shift correction sections 2136C, 2136M, 2136Y, and 2136K for each color (CMYK). It should be noted that to avoid duplication in description, description is given of color shift correction section processing using as an example the color shift correction section (C) 2136C relating to cyan (C), but equivalent configurations are applicable and equivalent processing are carried out in the other color shift correction sections 2136M, 2136Y, and 2136K also. Hereinafter description is given referring to 2136C as the color shift correction section 2136.

The color shift correction section 2136 is constituted by a coordinate conversion section 1501, a line buffer 1502, a smoothing determination section 1503, a tone value conversion section 1504, and an output position correction section 1505. The line buffer 1502 is a line unit memory that stores information prior to color shift correction processing from the halftone processing section 2135, and is capable of storing information of correction amounts in line units.

The coordinate conversion section 1501 carries out reconstruction of output image data based on main scanning direction and sub-scanning direction coordinate position data and the final color shift correction amount Freg(x) obtained by the color shift correction amount calculation section 2138. Specifically, the coordinate conversion section 1501 carries out correction processing of integer portions of the final color shift correction amounts Freg(x), namely, it carries out color shift corrections in single pixel units and carries out reconstruction of output image data.

Correction Processing of Coordinate Conversion Section

Figure 17:
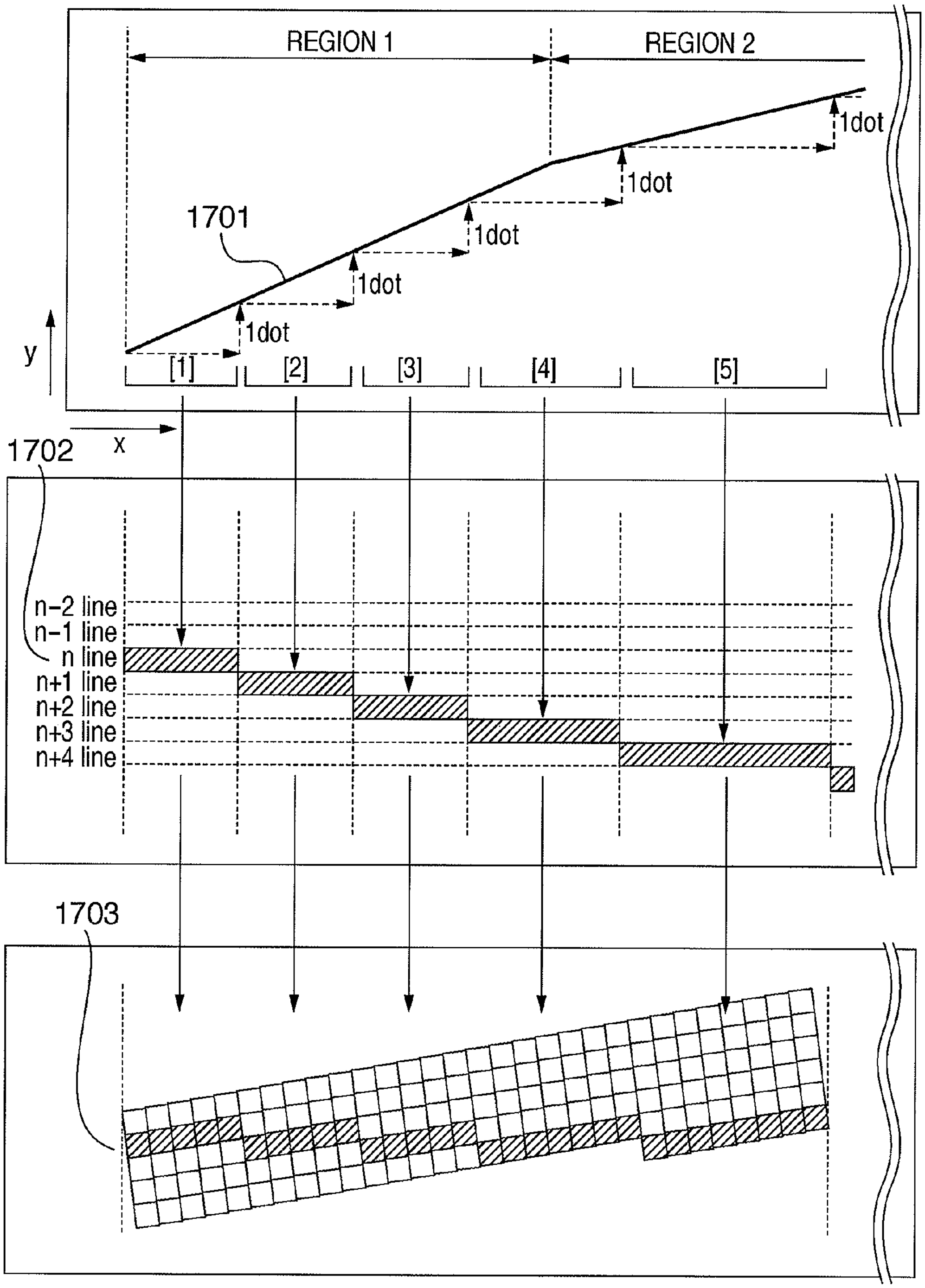
FIG. 17 is a diagram for describing correction process contents in a coordinate conversion section 1501.

Description is given using FIG. 17 of correction processing contents in the coordinate conversion section 1501. The coordinate conversion section 1501 offsets the sub-scanning direction coordinates of image data in response to integer portion values of the color shift correction amounts Freg(x) obtained from the color shift amounts of scanning lines that have undergone straight line approximation indicated by numeral 1701.

For example, as indicated by numeral 1702, when reconstructing sub-scanning direction coordinate positions for an n-th line of data, the color shift correction amounts Freg(x) in a main scanning direction portion region [1] are not less than zero but less than one pixel. The coordinate conversion section 1501 reads out the data of the n-th line.

Next, the color shift correction amounts Freg(x) in a main scanning direction portion region [2] are not less than one pixel but less than two pixels, and coordinate conversion processing is carried out such that a bitmap image of positions that have been offset by one line portion, data of (n+1)-th line, is read out. Furthermore, in a same manner coordinate conversion processing is carried out such that data of an (n+2)-th line is read out for a portion region [3] and data of an (n+3)-th line is read out for a portion region [4].

Numeral 1703 indicates an example of an exposure image that has been exposed on an image carrier of image data for which color shift correction processing has been carried out in pixel units by the coordinate conversion section 1501. The exposure positions in exposure images of portion regions [1] to [5] are offset corresponding to color shift correction amounts produced in each of the portion regions.

Sub-Pixel Correction Processing of Tone Value Conversion Section

Next, description is given using FIG. 18A to FIG. 18F of sub-pixel correction processing in the tone value conversion section 1504, that is, correction processing of decimal portions of shift amounts of the color shift correction amounts Freg(x). Correction of decimal portions of shift amounts is carried out by adjusting the tone values of pixels positioned before and after a pixel of interest in the sub-scanning direction.

FIG. 18A is a diagram illustrating a scanning line having an upward-sloping tilt. FIG. 18B is a diagram showing a bitmap image of a horizontal straight line prior to tone value conversion. FIG. 18C is an image for offsetting color shift caused by scanning line tilting shown in FIG. 18A, and is a correction image corresponding to the bitmap image shown in FIG. 18B.

To achieve the correction image shown in FIG. 18C, the tone value conversion section 1504 carries out tone value adjustments of pixels positioned before and after a pixel of interest in the sub-scanning direction. FIG. 18D is a tone value conversion table illustrating a relationship between the color shift correction amounts Freg(x) and correction coefficients for carrying out tone value conversions.

Here, a parameter k indicates an integer portion (discarding decimal portions) of the color shift correction amounts Freg (x) and represents a sub-scanning direction correction amount in a single pixel unit. A parameter α and a parameter β (formula 5) are correction coefficients for carrying out sub-pixel corrections in the sub-scanning direction, and are parameters that indicate distribution ratios of preceding and succeeding pixels in the sub-scanning direction according to decimal portion information of the color shift correction amounts Freg(x). Here, α is a distribution ratio of preceding pixels with respect to a pixel of interest and β is a distribution ratio of succeeding pixels with respect to a pixel of interest.

$$\beta = \mathrm{Freg}(x) - k \qquad \text{Formula 5-1}$$

$$\alpha = 1 - \beta \qquad \text{Formula 5-2}$$

FIG. 18E illustrates a bitmap image in which tone value conversions have been carried out for adjusting the tone value ratios of preceding and succeeding pixels positioned in the sub-scanning direction in accordance with coefficients of the tone value conversion table shown in FIG. 18D. FIG. 18F is an image of a bitmap image that has undergone tone value conversions exposed on an image carrier. The straight line image formed based on this exposure image is formed as a horizontal straight line in which main scanning line tilting is offset.

On the other hand, for images of patterns such as intricately detailed images, not carrying sub-pixel corrections is better from a perspective of image quality. In this case, the correction processing by the tone value conversion section 1504 may be set such that the tone value distribution ratios of preceding and succeeding pixels in the sub-scanning direction in the tone value conversion table are set uniformly with parameter β=0 and α=1 as shown in FIG. 19A.

With these parameter settings, sub-pixel color shift corrections are disabled regardless of the calculation results of the color shift correction amount calculation section 2138. FIG. 19B is a diagram showing a bitmap image in which single pixel unit coordinate conversions have been carried out in the sub-scanning direction based on integer portion data of the color shift correction amounts Freg(x). FIG. 19C is an image of the bitmap image exposed on an image carrier. The image formed based on this exposure image is formed as a horizontal straight line in which main scanning line tilting is offset.

Here, the smoothing determination section 1503 carries out a determination of images for which sub-pixel color shift correction is to be carried out and images for which it is not to be carried out. A determination of the smoothing determination section 1503 may be made using pattern matching comparisons of window data obtained from the line buffer 1502 and edge pattern information of an unshown edge pattern storage table. In the case where edge detection is carried out of an image to be detected using these comparisons and the image is determined to be an edge portion image as a result of judging whether or not the image is an edge portion image, processing of the tone value conversion section 1504 is executed. Based on a determination result of the smoothing determination section 1503, a tone value conversion table to be used by an unshown tone value conversion table selection portion is selected. Then, the tone value conversion section 1504 carries out correction processing based on the selected tone value conversion table.

Image Output Processing by Output Position Correction Section

Figure 20:
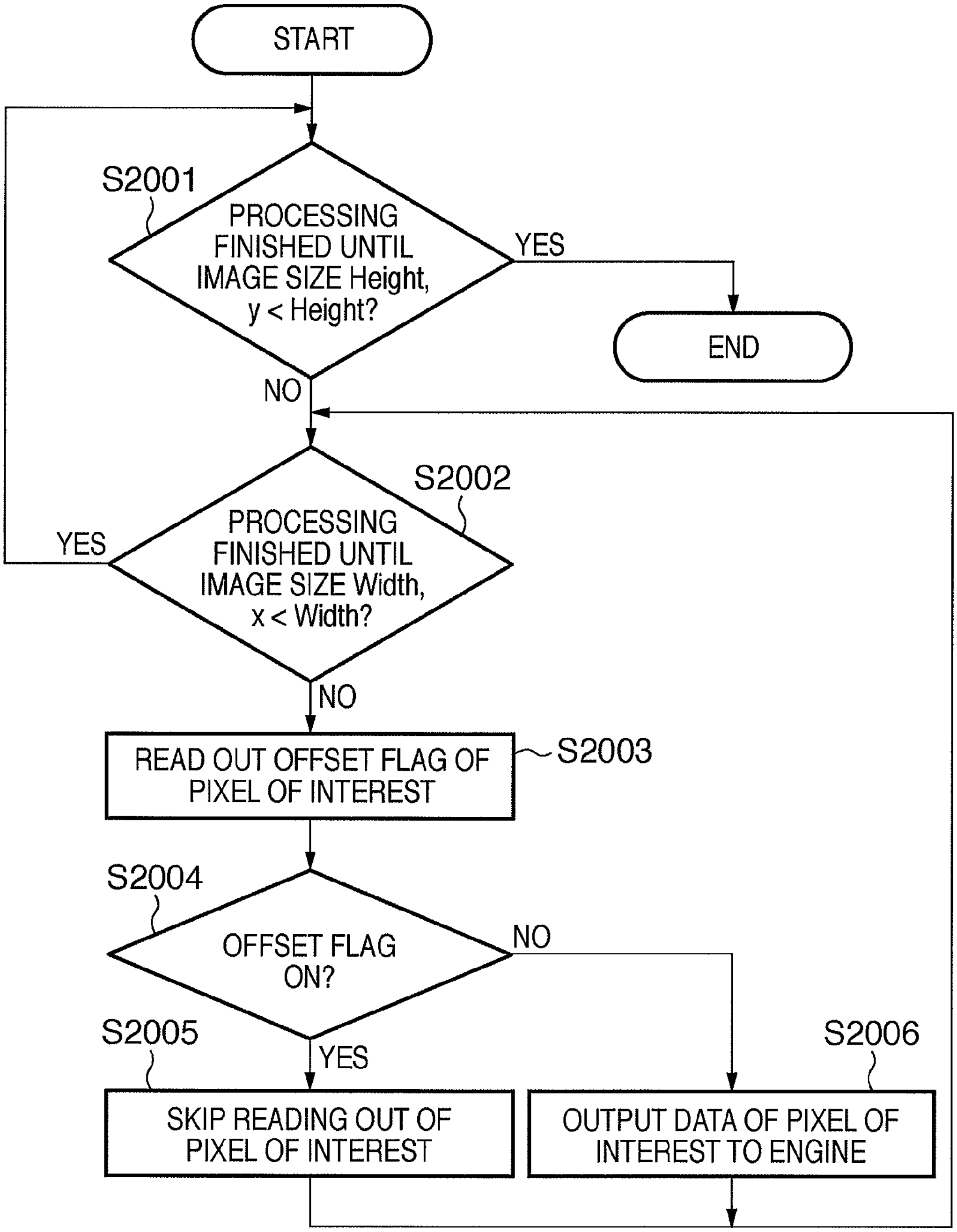
FIG. 20 is a flowchart showing an output position correction process that is executed based on a result of the color shift correction process shown in FIG. 12.

Next, description is given using FIG. 20 of details of output position control using offset flags in the output position correction section 1505.

FIG. 20 is a flowchart showing an output position correction process that is executed based on a result of the color shift correction process shown in FIG. 12. First, at step S2001, a judgment is performed as to whether or not processing has finished of all the lines (corresponding to the image size height). When a result of the judgment is that processing is not finished for all the lines, the procedure proceeds to step S2002 and a judgment is performed as to whether or not processing has finished of all the regions (image size width). Here, when processing is not finished for all the regions, the procedure proceeds to step S2003 and an offset flag of the pixel of interest is read out. Then, at step S2004, a determination is performed as to whether or not the offset flag of the pixel of interest is ON. When a result of the determination is that the offset flag is ON, the procedure proceeds to step S2005 and the reading out of the pixel of interest is skipped, and the procedure returns to step S2002.

On the other hand, when a result of the determination at step S2004 is that the offset flag is OFF, the procedure proceeds to step S2006 and the data of the pixel of interest is outputted to the engine, and the procedure returns to step S2002.

Furthermore, when the result of the judgment at the above-mentioned step S2002 is that processing is finished for all the regions, the procedure returns to step S2001. Furthermore, when the result of the judgment at step S2001 is that processing is finished for all the lines, the procedure finishes.

Figure 21:
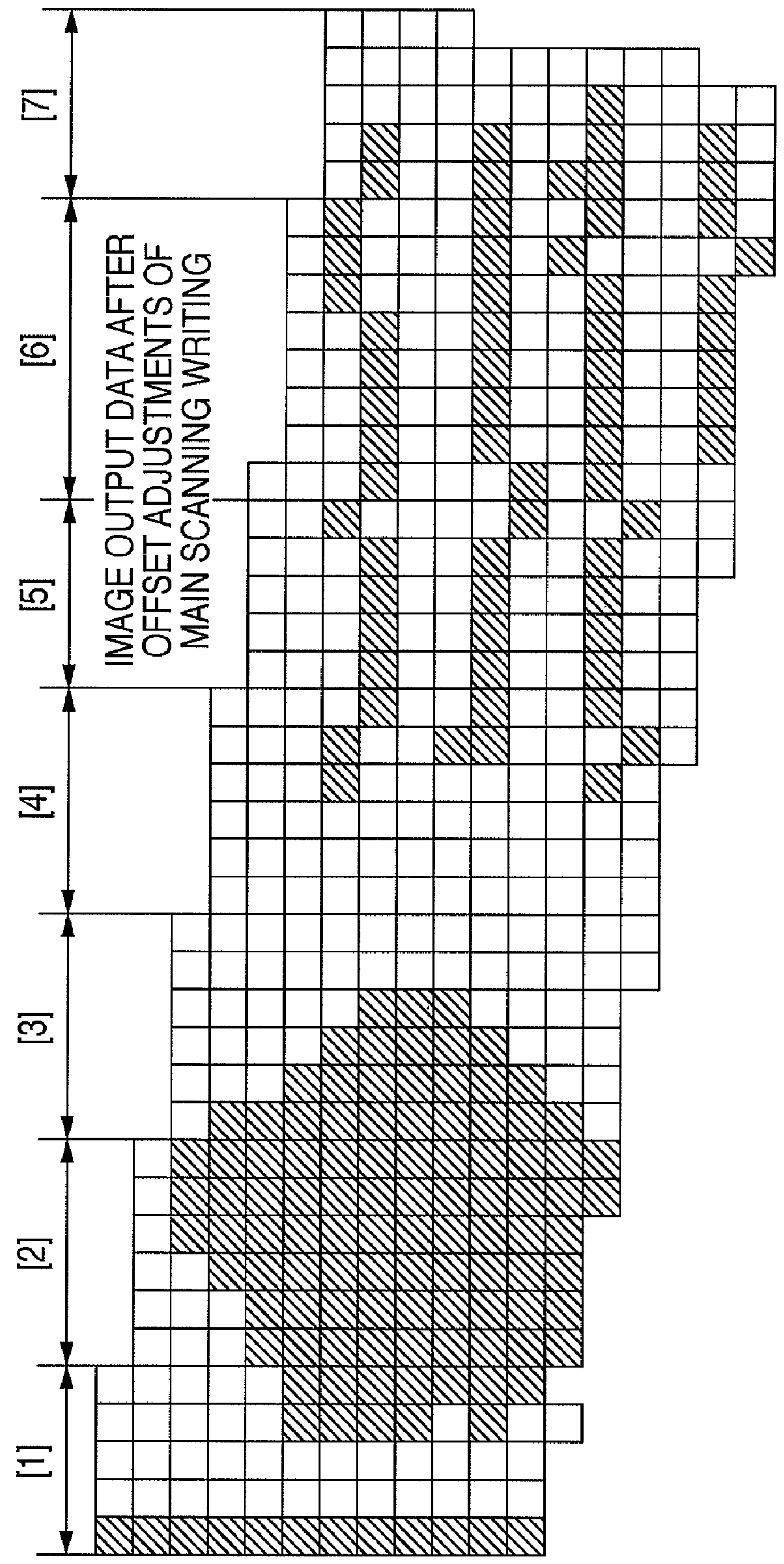
FIG. 21 is a diagram showing a bitmap image in which writing positions in skewing have been corrected by an output position correction section 1505.
Figure 22:
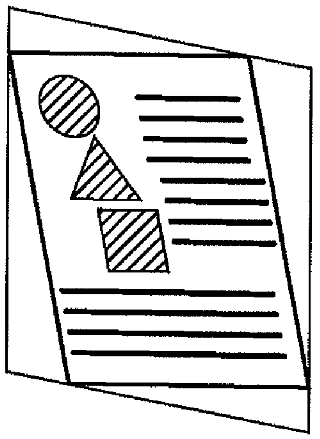
FIG. 22 is a diagram showing an output image after skew correction processing and color shift correction processing have been carried out.

For example, when the bitmap image shown in FIG. 15 has been inputted to the output position correction section 1505, processing is performed by the output position correction section 1505 to achieve a bitmap image such as that shown in FIG. 21, thereby executing correction of writing positions in skewing. FIG. 22 is a diagram showing an output image after skew correction processing and color shift correction processing have been carried out.

With the first embodiment, skew correction processing of an original that has been read by a scanner and electrical color shift correction processing can be achieved using a one-time correction process.

Second Embodiment

Next, detailed description is given of a second embodiment of the present invention with reference to the accompanying drawings. In the second embodiment, skew amounts when reading a plurality of originals are stored and skewing is corrected when outputting by combining these for one sheet of paper. It should be noted in regard to identical processing in the first embodiment that identical symbols are applied and description thereof is omitted.

Image Reading Operation

Figure 23:
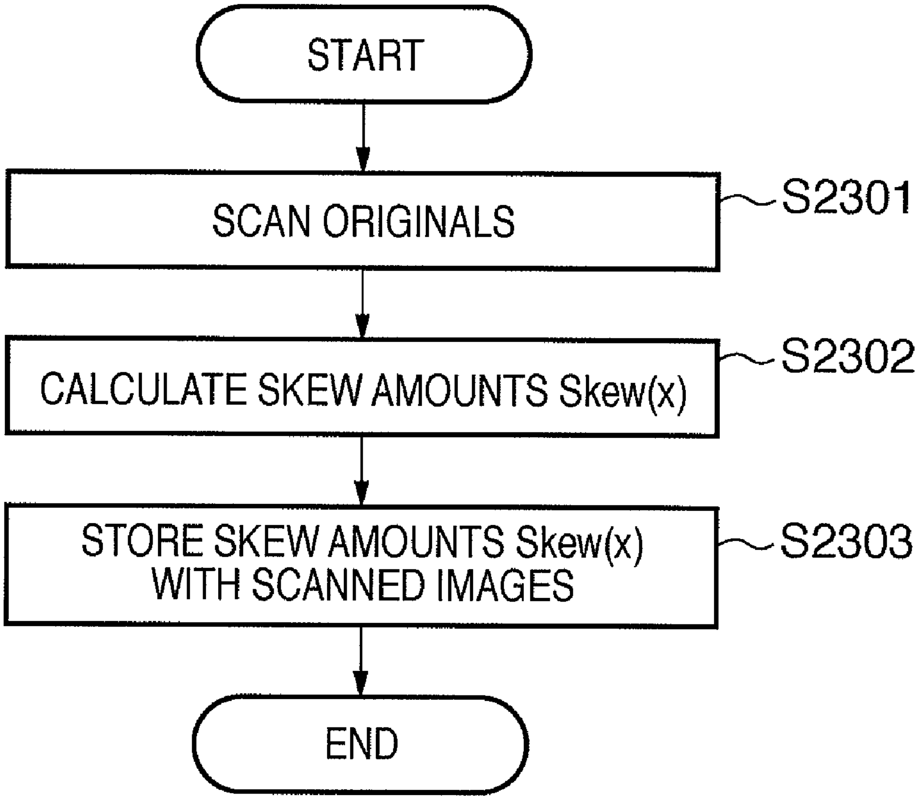
FIG. 23 is a flowchart showing an image reading process according to a second embodiment.

Description is given using FIG. 23 of an image reading operation executed according to control of an unshown CPU and the skew amount calculation section 2122.

FIG. 23 is a flowchart showing an image reading process according to the second embodiment. First, at step S2301, the scanner 101 scans a plurality of originals, then at step S2302, the skew amount calculation section 2122 calculates a skew amount of the originals. Next, at step S2303, the calculated skew amount is stored in an appended information region when storing the scanned original images, and the process finishes.

Skew Amount Calculations in Combining Operation

Next, description is given of a skew amount calculation method during a combining operation executed by a CPU and the color shift correction amount calculation section 2138. In this example, description is given of a case in which a combination of two sheets of originals is executed. Furthermore, the skew amount calculations during the combining operation are executed within the color shift correction amount calculation section 2138.

Figure 24:
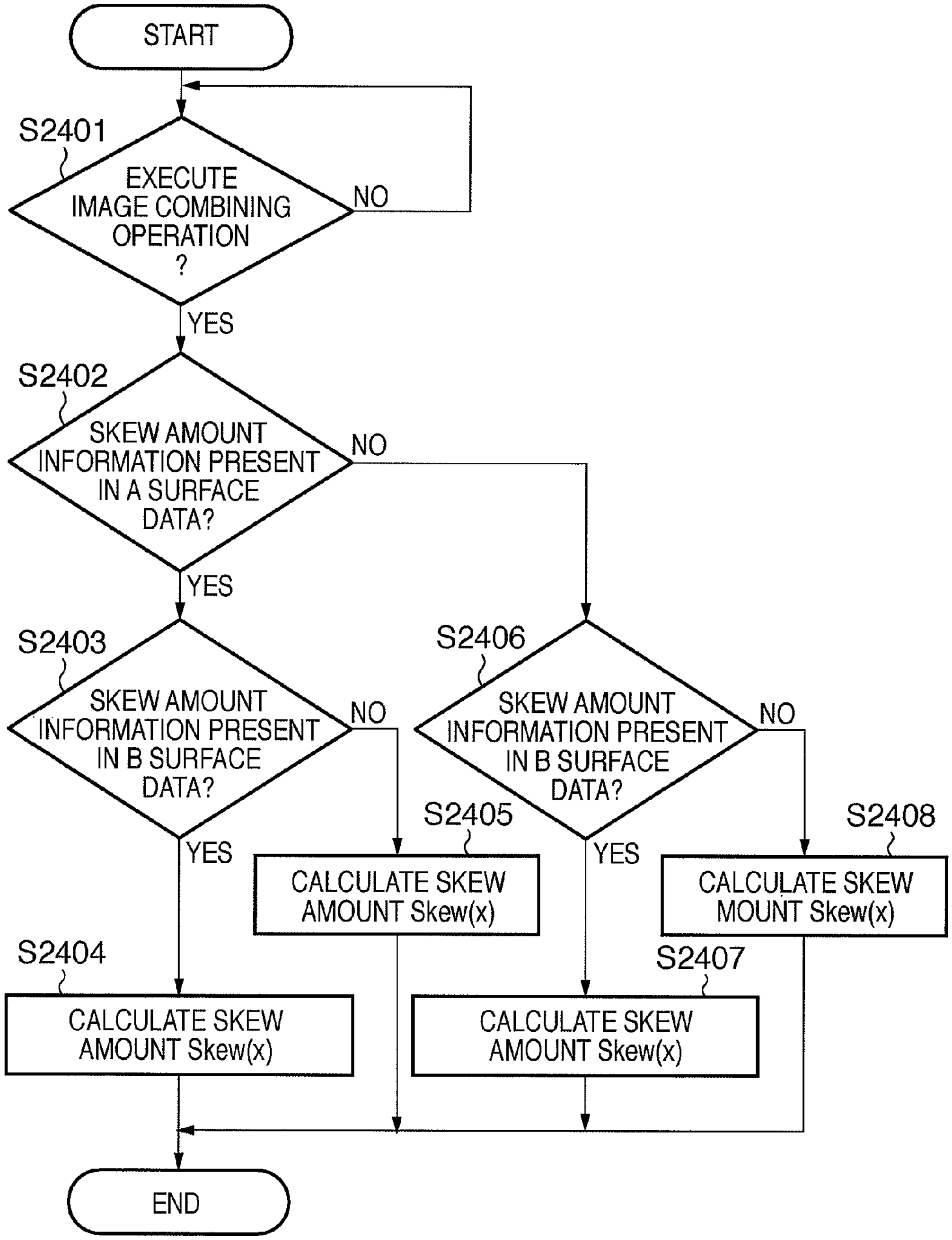
FIG. 24 is a flowchart showing a skew amount calculation process according to the second embodiment.
Figure 25A:
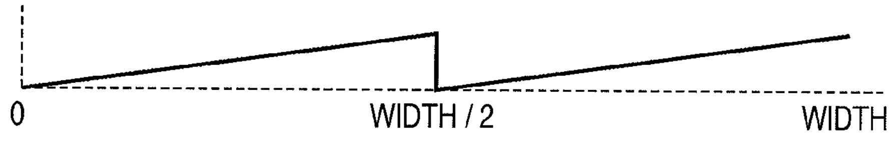
FIG. 25A to FIG. 25D are diagrams showing single examples of skew amount calculation results according to the second embodiment.
Figure 25B:
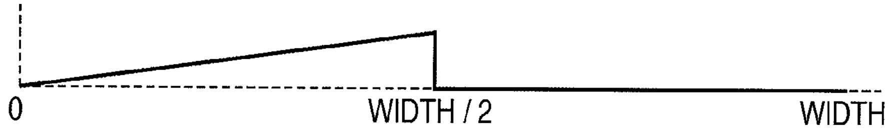
Figure 25C:
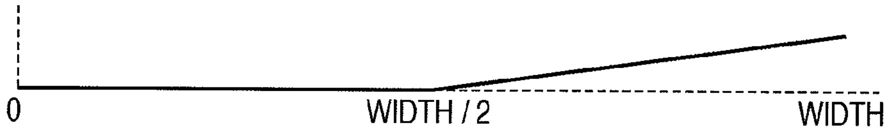
Figure 25D:
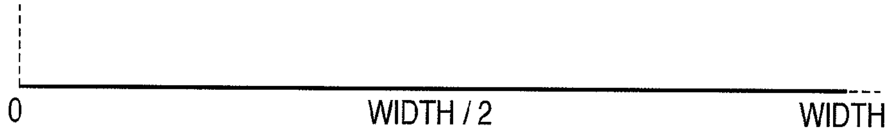

FIG. 24 is a flowchart showing a skew amount calculation process according to the second embodiment. First, at step S2401, a determination is made as to whether or not an image combining process has been specified at the operation section 103. When a result of the determination is that an image combining process has been specified, the procedure proceeds to step S2402 and a determination is made as to whether or not skew amount information is present in the appended information of the image data corresponding to an A surface of the original. Here, if skew amount information is appended in the A surface image data, the procedure proceeds to step S2403 and a determination is made as to whether or not skew amount information is present in the appended information of the image data corresponding to a B surface. If a result of the determination is that skew amount information is appended in the B surface image data, then the procedure proceeds to step S2404, and the skew amount Skew(x) is calculated using the following formula, thereby finishing this process.

$$\text{When: } \mathrm{Skew}(x) = SkewA(x)0 < x < \frac{\mathrm{Width}}{2}$$

$$\text{When: } \mathrm{Skew}(x) = SkewB(x)\frac{\mathrm{Width}}{2} < x < \mathrm{Width}$$

Here, SkewA(x) indicates the skew amount of the A surface image data and SkewB(x) indicates the skew amount of the B surface image data.

On the other hand, in the case where skew amount information is not appended in the B surface image data at step S2403, then the procedure proceeds to step S2405, and the skew amount is calculated using the following formula, thereby finishing this process.

$$\text{When: } \mathrm{Skew}(x) = SkewA(x)0 < x < \frac{\mathrm{Width}}{2}$$

$$\text{When: } \mathrm{Skew}(x) = 0\frac{\mathrm{Width}}{2} < x < \mathrm{Width}$$

On the other hand, in the case where skew amount information is not appended in the A surface image data at the above-mentioned step S2402, the procedure proceeds to step S2406 and a determination is made as to whether or not skew amount information is present in the appended information of the image data corresponding to the B surface. When a result of the determination is that skew amount information is appended in the B surface image data, then the procedure proceeds to step S2407, and the skew amount is calculated using the following formula, thereby finishing this process.

$$\text{When: } \mathrm{Skew}(x) = 0\ 0 < x < \frac{\mathrm{Width}}{2}$$

$$\text{When: } \mathrm{Skew}(x) = SkewB(x)\frac{\mathrm{Width}}{2} < x < \mathrm{Width}$$

On the other hand, in the case where skew amount information is not appended in the B surface image data at step S2406, then the procedure proceeds to step S2408, and the skew amount Skew(x) is set to zero, thereby finishing this process.

FIG. 25A, FIG. 25B, FIG. 25C, and FIG. 25D are diagrams showing skew amounts calculated in steps S2404, S2405, S2407, and S2408.

Color Shift Correction Processing in Combining Operation

Figure 26:
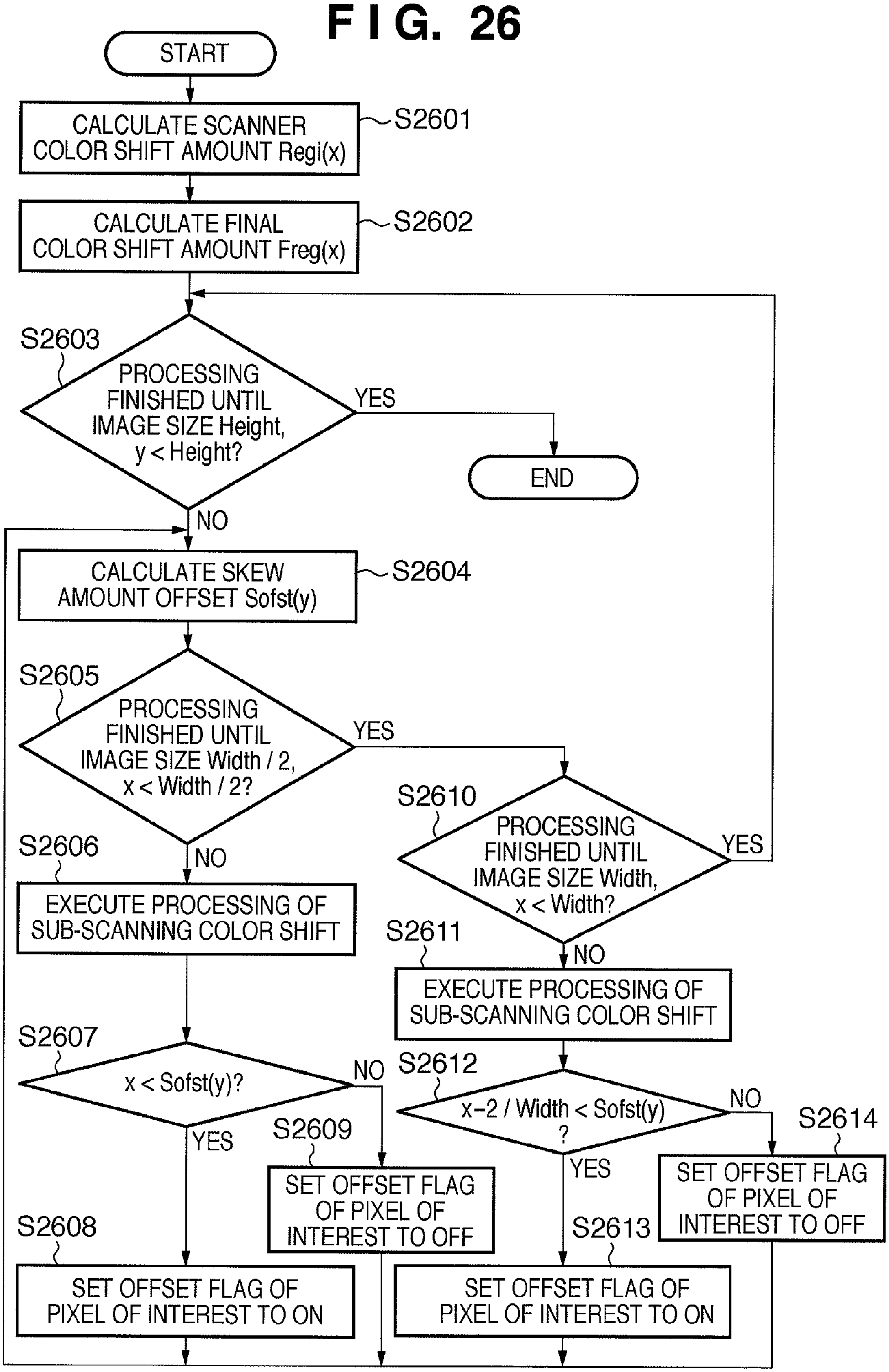
FIG. 26 is a flowchart showing a color shift correction process according to the second embodiment.

Next, description is given using FIG. 26 of a color shift correction process executed by an unshown CPU, the color shift correction section 2136, and the color shift correction amount calculation section 2138.

FIG. 26 is a flowchart showing a color shift correction process according to the second embodiment. First, at step S2601, color shift profile information for each color is obtained from the color shift amount storage section 1021, and a scanner color shift amount Regi(x) shown in FIG. 9 is calculated.

Figure 27A:
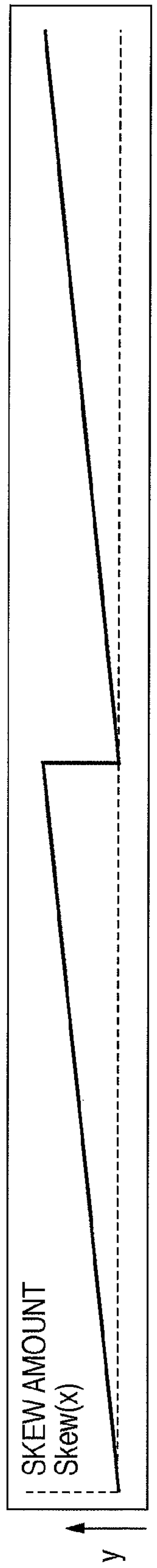
FIG. 27A to FIG. 27F are diagrams for describing correction processing in the case where an A surface and a B surface are both skewed.
Figure 27B:
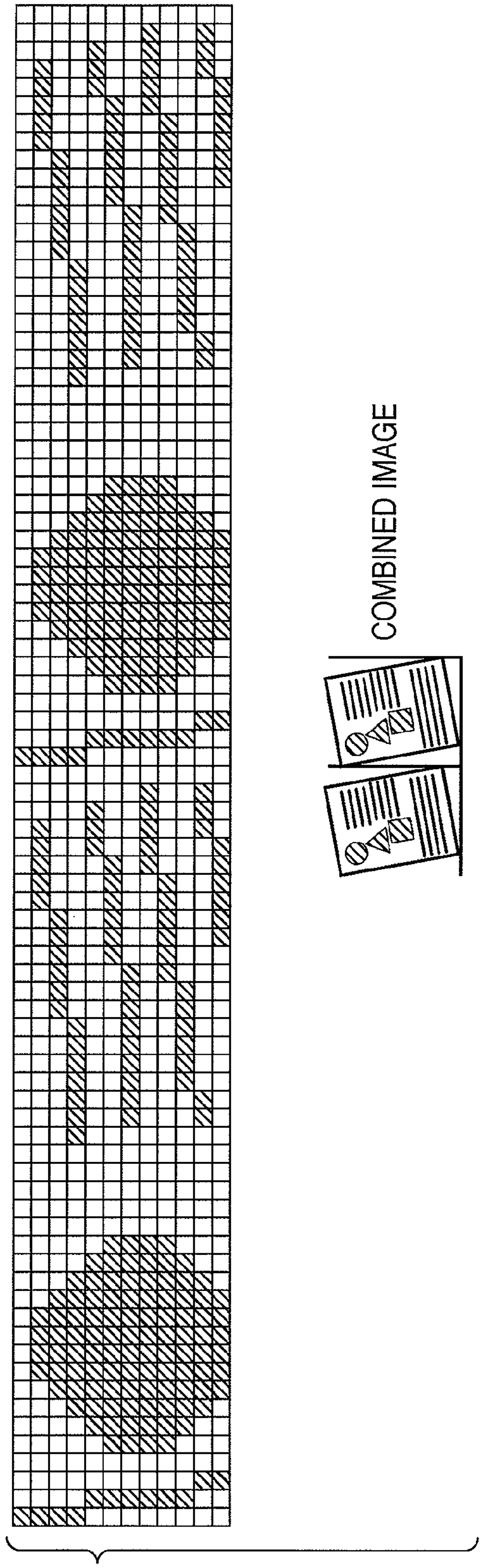
Figure 27C:
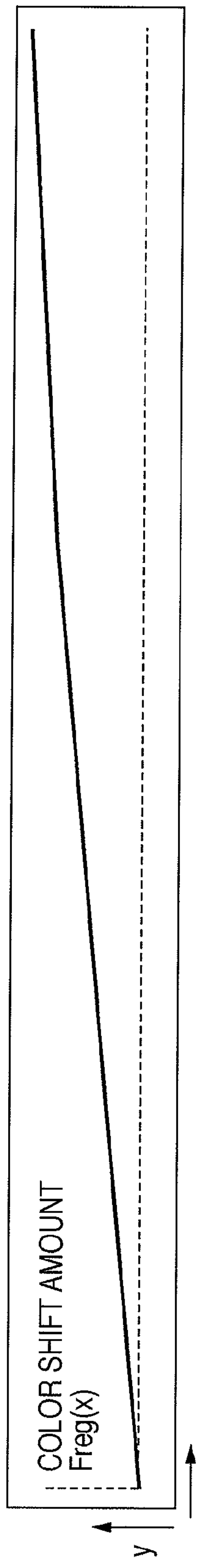
Figure 27D:
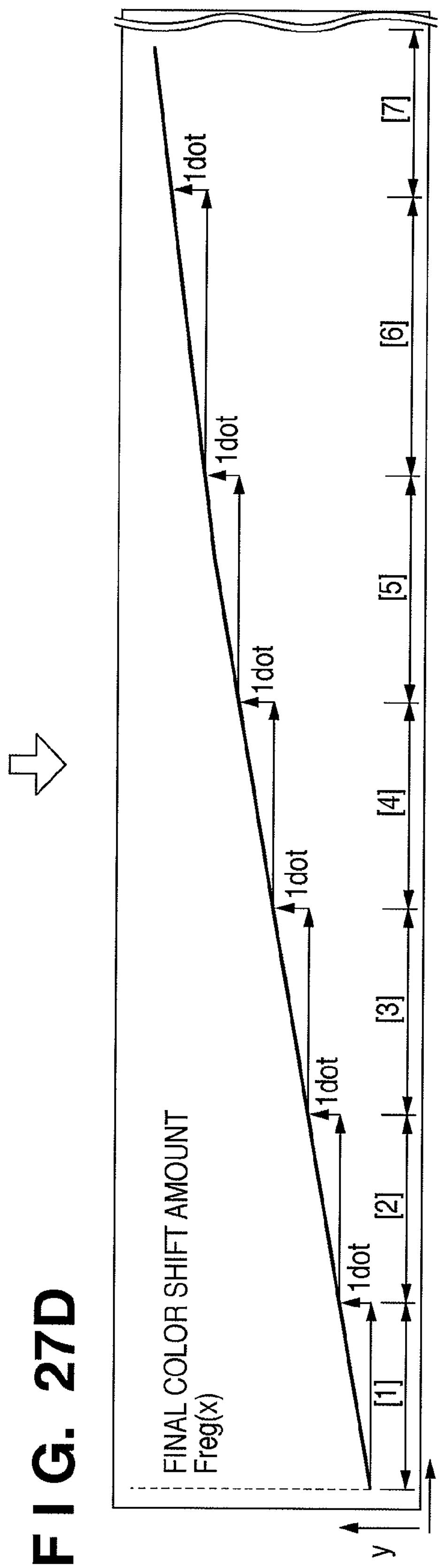
Figure 28A:
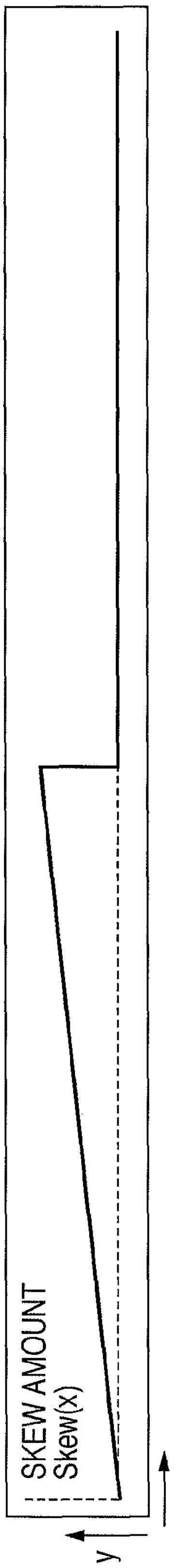
FIG. 28A to FIG. 28F are diagrams for describing correction processing in the case where only the A surface is skewed.
Figure 28B:
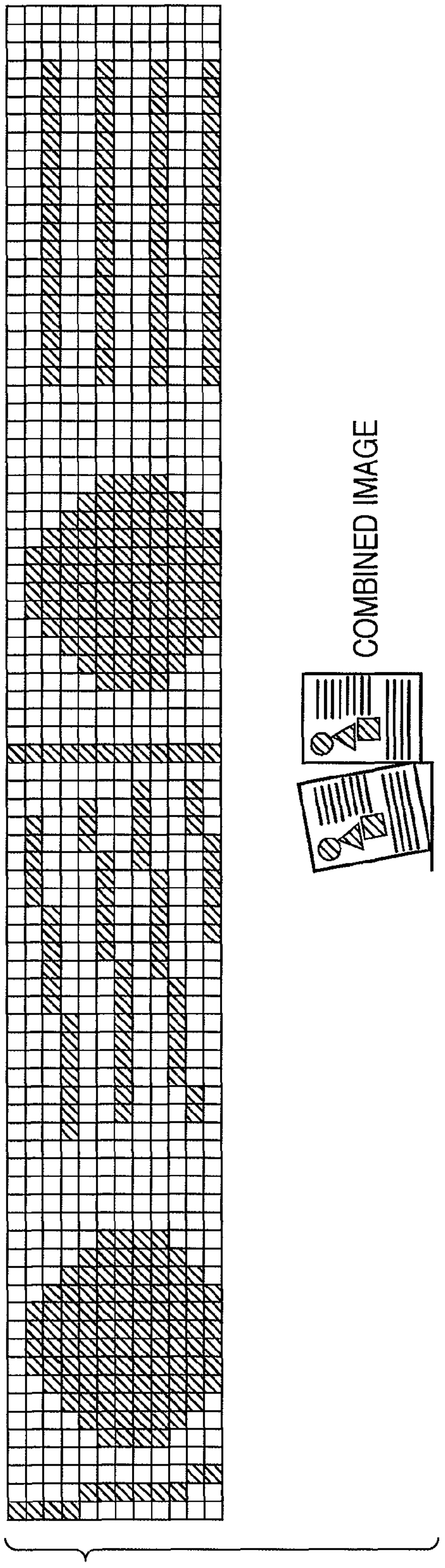
Figure 28C:
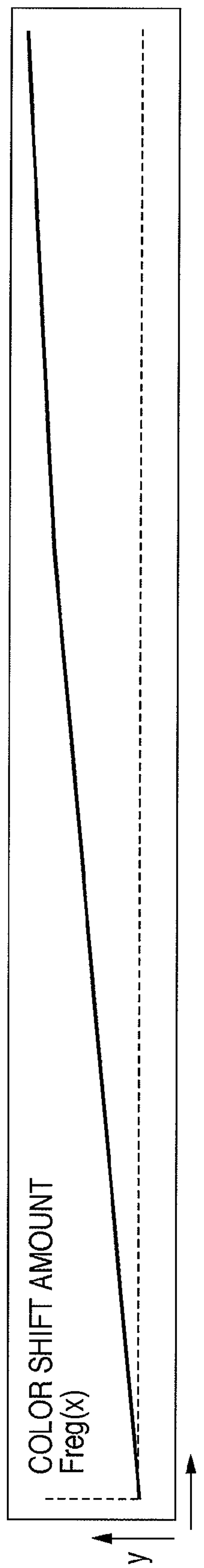
Figure 28D:
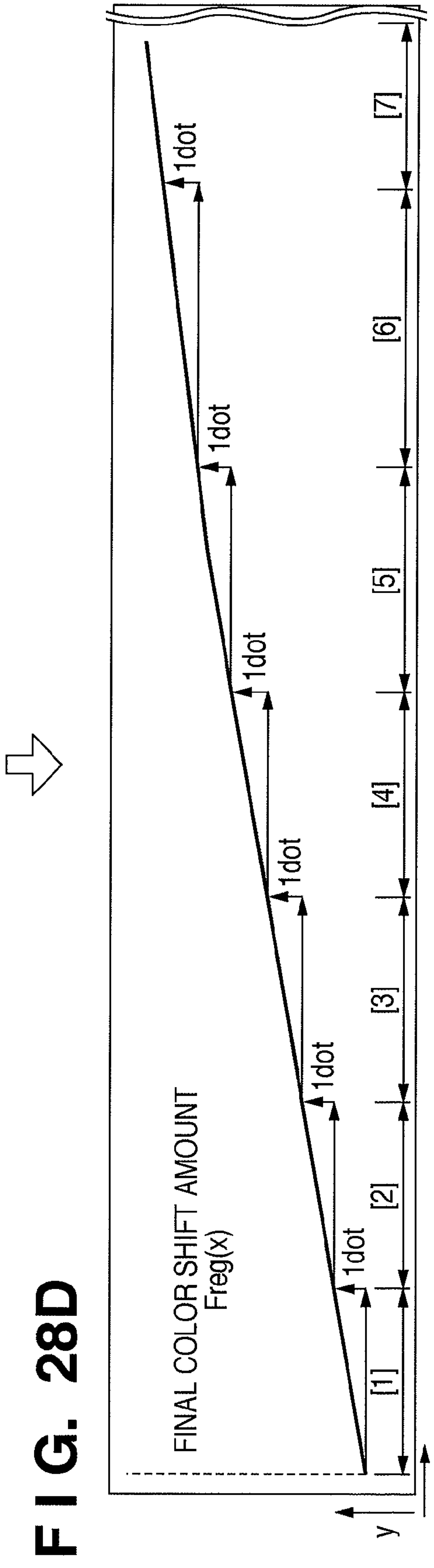
Figure 29A:
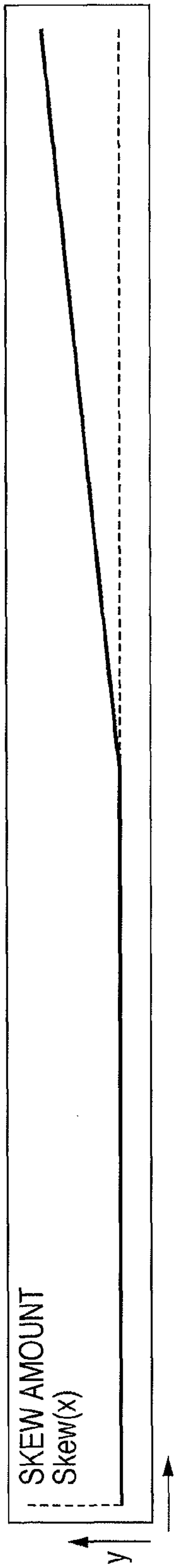
FIG. 29A to FIG. 29F are diagrams for describing correction processing in the case where only the B surface is skewed.
Figure 29B:
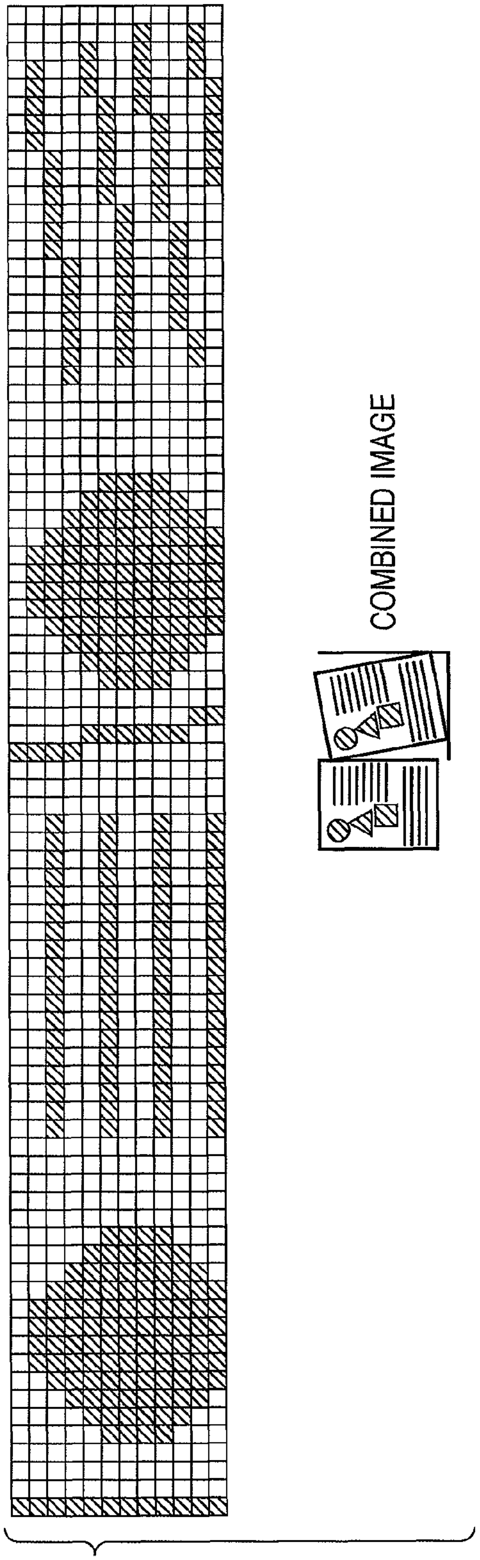
Figure 29C:
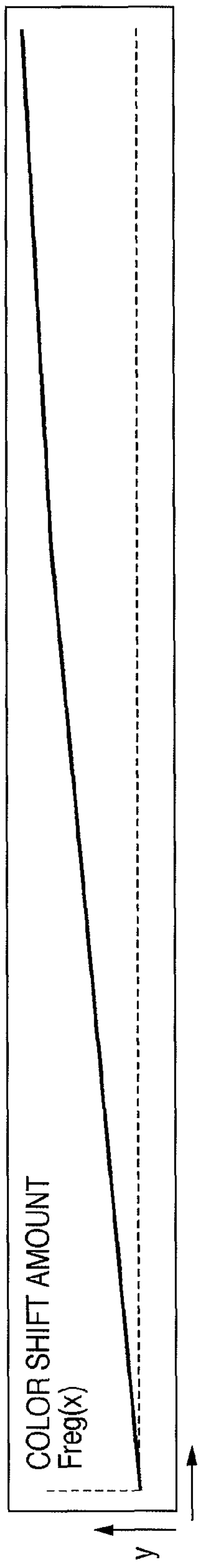
Figure 29D:
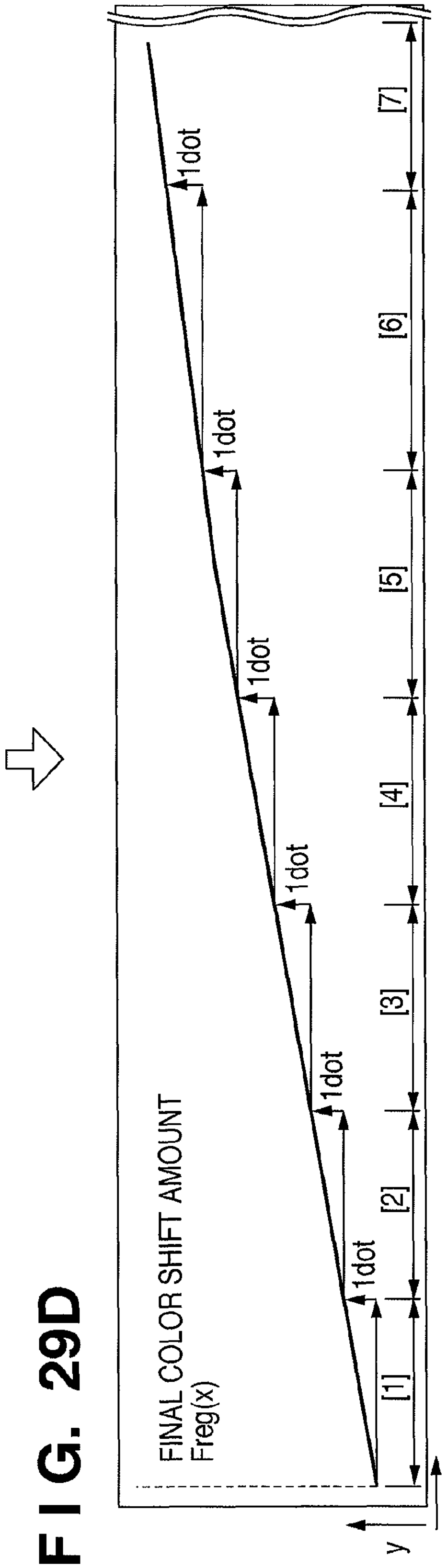

Next, at step S2602, a final color shift amount Freg(x) is calculated from the skew amount Skew(x) calculated by the process shown in FIG. 24 and the scanner color shift amount Regi(x) calculated at step S2601. FIGS. 27D, 28D, and 29D are diagrams indicating the final color shift amounts Freg(x).

It should be noted that the final color shift amount is calculated using the above-mentioned formula 3 in the same manner as the first embodiment. Furthermore, FIG. 27A to FIG. 27F are diagrams for describing correction processing in the case where the A surface and the B surface are both skewed. Further still, FIG. 28A to FIG. 28F are diagrams for describing correction processing in the case where only the A surface is skewed. And FIG. 29A to FIG. 29F are diagrams for describing correction processing in the case where only the B surface is skewed.

Next, at step S2603, a determination is performed as to whether or not processing is finished of all the scanning lines (image size height). When a result of the determination is that processing is not finished for all the scanning lines, the procedure proceeds to step S2604 and the skew amount offset Sofst(y) is calculated. The skew amount offset Sofst(y) is calculated using the above-mentioned formula 4 for a purpose of detecting a rendering position in the main scanning direction corresponding to the skew amount of the original image.

Next, at step S2605, a determination is performed as to whether or not processing is finished of all the regions of the A surface. When a result of the determination is that processing is not finished for all the regions of the A surface, the procedure proceeds to step S2606 and the color shift correction section 2136 executes sub-scanning color shift processing in accordance with the final color shift amount. Then, at step S2607, a determination is performed as to whether or not a pixel of interest coordinate x corrected at step S2606 is larger than the skew amount offset. When a result of the determination is that the pixel of interest coordinate x is smaller than the skew amount offset, then the procedure proceeds to step S2608, and the pixel of interest is judged to be a pixel without a skewed object, the offset flag is set to ON, and the procedure returns to step S2604.

On the other hand, when a result of the determination at step S2607 is that the pixel of interest coordinate x is not smaller than the skew amount offset, then the procedure proceeds to step S2609, and the pixel of interest is judged to be a pixel in which an object to be rendered is present, the offset flag is set to OFF, and the procedure returns to step S2604.

Furthermore, when the result of the determination at step S2605 is that processing is finished for all the regions of the A surface, then the procedure proceeds to step S2610, and a determination is performed as to whether or not processing is finished for all the regions of the B surface. When a result of the determination is that processing is not finished for all the regions of the B surface, the procedure proceeds to step S2611 and the color shift correction section 2136 executes sub-scanning color shift processing in accordance with the final color shift amount calculated at step S2602. Then, at step S2612, a determination is performed as to whether or not a pixel of interest coordinate corrected at step S2611 is smaller than the skew amount offset. When a result of the determination is that the pixel of interest coordinate is smaller than the skew amount offset, then the procedure proceeds to step S2613, and the pixel of interest is judged to be a pixel without a skewed object, the offset flag is set to ON, and the procedure returns to step S2604.

On the other hand, when a result of the determination at step S2612 is that the pixel of interest coordinate is not smaller than the skew amount offset, then the procedure proceeds to step S2614, and the pixel of interest is judged to be a pixel in which an object to be rendered is present, the offset flag is set to OFF, and the procedure returns to step S2604.

Furthermore, when it is determined at step S2610 that processing is finished for all the regions of the B surface, then the procedure returns to step S2603.

On the other hand, when it is determined at step S2603 that processing is finished for all the scanning lines, the procedure finishes.

Image Output Processing by Output Position Correction Section

Next, since the processing is the same as the first embodiment in regard to output position control using offset flags in the output position correction section 1505, description thereof is omitted.

Figure 27E:
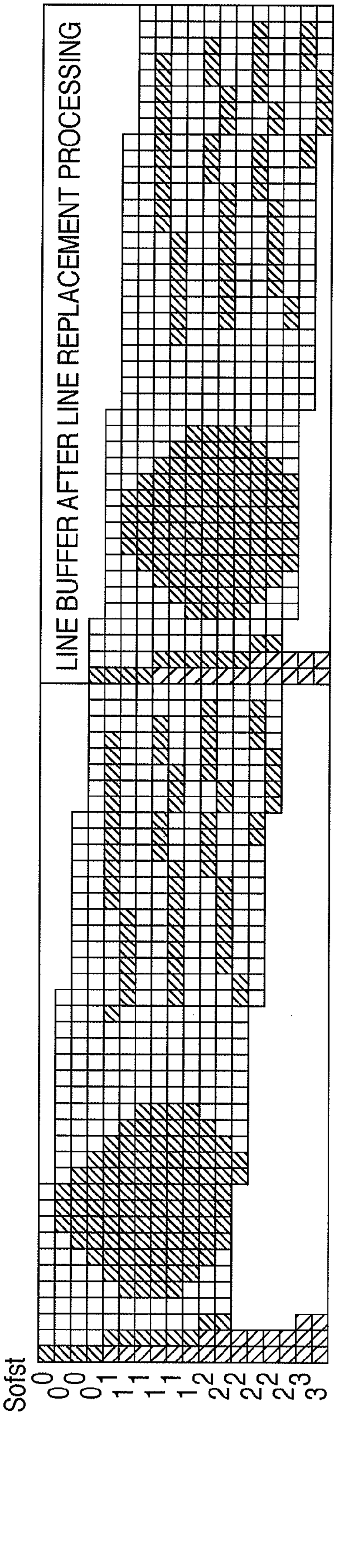
Figure 27F:
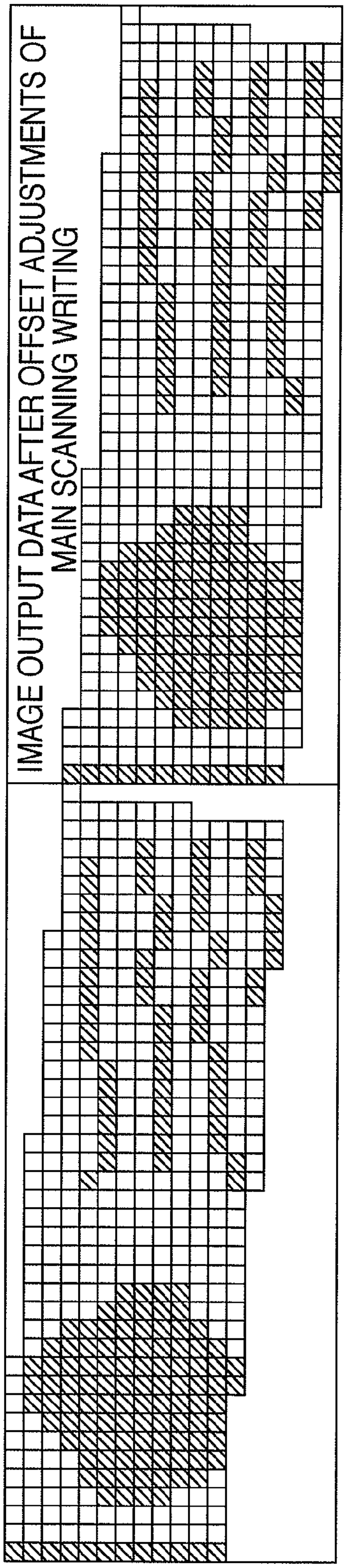
Figure 28E:
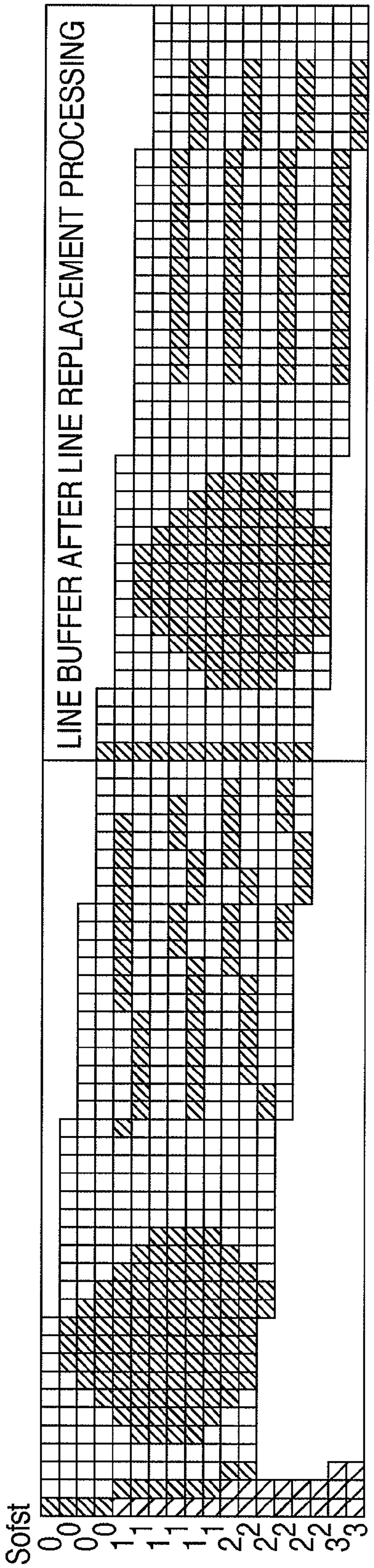
Figure 28F:
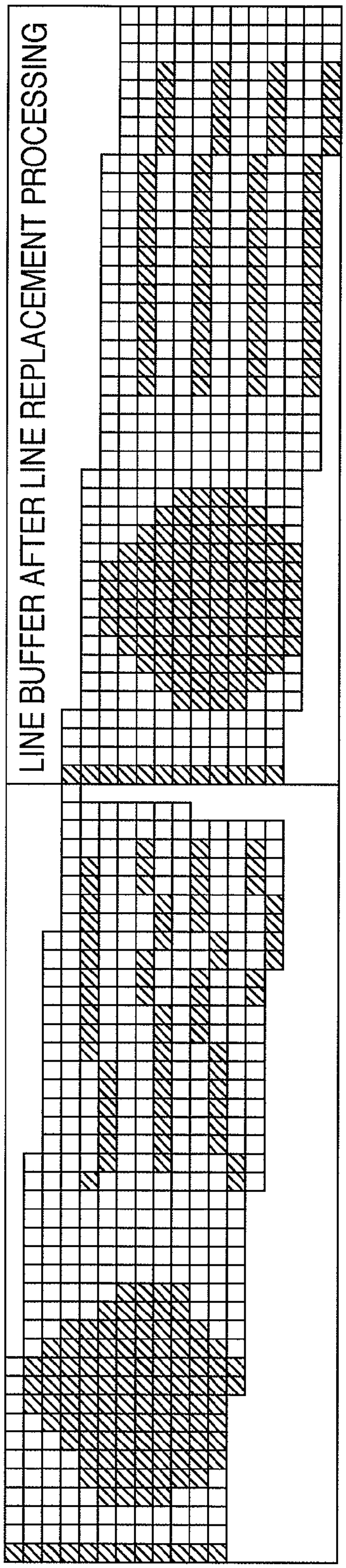
Figure 29E:
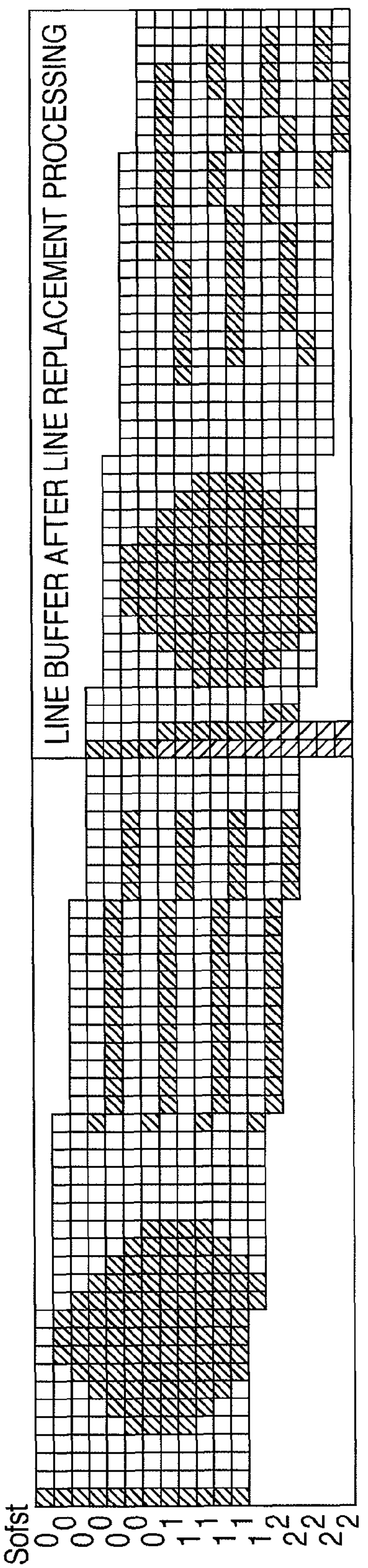
Figure 29F:
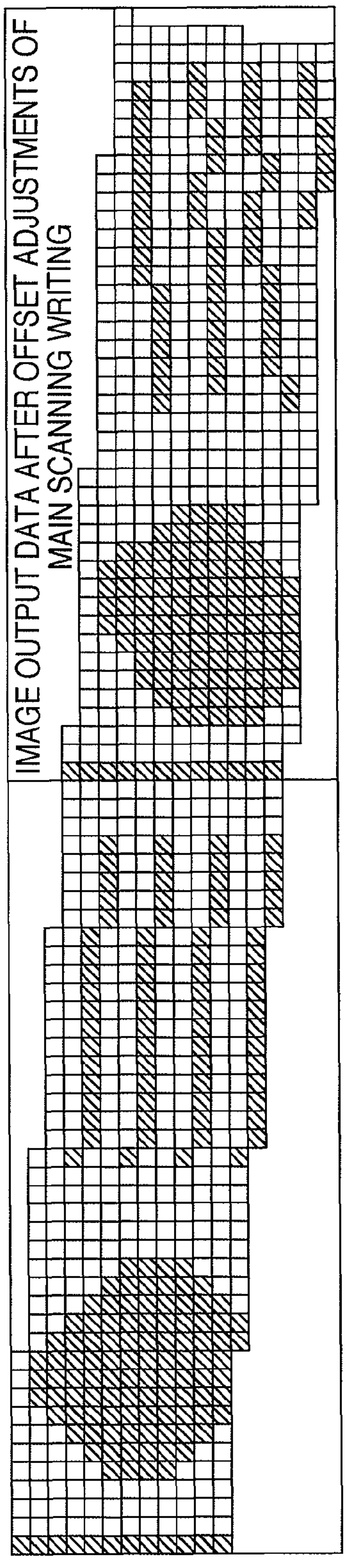

FIG. 27E, FIG. 28E, and FIG. 29E are diagrams showing bitmap images that are inputted to the output position correction section 1505 respectively. Pixels shown as gray in these diagrams are pixels in which the offset flag has been set to ON. Furthermore, FIG. 27F, FIG. 28F, and FIG. 29F are diagrams showing bitmap images that have been processed by the output position correction section 1505, and in which corrections of writing positions in skewing have been carried out.

With the second embodiment, in the case where a plurality of originals are read and combined for output, skew correction processing of originals that have been read by a scanner and electrical color shift correction processing can be achieved using a one-time correction process in the same manner as the first embodiment.

It should be noted that the present invention may be applied to a system constituted by multiple apparatuses (for example, such devices as a host computer, an interface device, a reader, and a printer) and may also be applied to an apparatus constituted by a single device (for example, a copier or a facsimile machine or the like).

Furthermore, a system or a device may be provided with a recording medium on which is recorded program code of software for achieving a function of the foregoing embodiments, and a computer (CPU or MPU) of this system or device may read out and execute the program code stored on the recording medium. It is evident that an object of the present invention may also be achieved in this manner.

In this case, the actual program code that is read out from the computer-readable recording medium achieves the functionality of the foregoing embodiments, such that the recording medium on which the program code is stored constitutes the present invention.

Examples of recording media that can be used for providing the program code include a flexible disk, a hard disk, an optical disk, a magneto-optical disk, a CD-ROM, a CD-R, magnetic tape, a nonvolatile memory card, and a ROM or the like.

Furthermore, it is evident that the functionality of the foregoing embodiments may be achieved not only by executing program code read out by a computer, but also achieved in the following case. Namely, the functionality of the foregoing embodiments may be achieved in a case of having an OS (operating system) or the like that runs on a computer carry out a part or all of the actual processing according to instructions of the program code such that the functionality of the foregoing embodiments is achieved by the processing thereof.

Further still, it is possible for the program code read out from the recording medium to be written onto a memory provided in an extension board inserted into the computer or an extension unit connected to the computer. Subsequently, a CPU or the like provided in the extension board or extension unit carries out a part or all of the actual processing according to instructions of the program code such that the functionality of the foregoing embodiments is achieved by the processing thereof. Needles to say, such a case can also achieve the functionality of the foregoing embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-099802, filed Apr. 7, 2008, which is hereby incorporated by reference herein in its entirety.

What is claimed is:

1. An image forming apparatus that reads an original and forms an image of the original that has been read, comprising:

a skew amount calculation unit constructed to calculate a skew amount of the original for each position of a main scanning direction when the original has been read;

an obtaining unit constructed to obtain from a storage unit a shift amount of a sub-scanning direction to an ideal scanning line of an optical beam used for image formation in the image forming apparatus, for each position of the main scanning direction;

a color shift correction amount calculation unit constructed to calculate a color shift correction amount for correcting color shift in an output image by adding the skew amount calculated for each position of the main scanning direction and the shift amount obtained for each position of the main scanning direction;

a color shift correction unit constructed to correct the color shift based on the calculated color shift correction amount; and a determination unit constructed to determine whether or not a pixel of interest coordinate in an image in which the color shift has been corrected is equal to or larger than a skew amount offset, wherein when the determination unit determines the pixel of interest coordinate is equal to or larger than the skew amount offset, data of the pixel of interest is output to an engine, wherein when the determination unit determines the pixel of interest coordinate is smaller than the skew amount offset, reading out of the pixel of interest is skipped, and wherein the skew amount offset indicates a drawing position in the main scanning direction based on the skew amount of the original.

2. The apparatus according to claim 1, wherein the skew amount is a skew amount in a sub-scanning direction calculated from an upper left coordinate and an upper right coordinate of the original when the original has been read.

3. The apparatus according to claim 1, wherein the color shift correction amount calculation unit calculates a color shift correction amount for correcting the skew amount and the color shift of the pixels of the original that has been read.

4. The apparatus according to claim 3, wherein the color shift correction unit corrects the color shift by controlling an output position of the pixels when the image of the original is to be formed based on the color shift correction amount that has been calculated for the pixels.

5. The apparatus according to claim 4, wherein the color shift correction unit further determines whether or not a pixel of interest is a pixel in which an edge portion image is to be formed, and carries out a tone value conversion of the pixel of interest when the pixel is for an edge portion image.

6. A color shift correction method of an image forming apparatus that reads an original and forms an image of the original that has been read, comprising:

calculating a skew amount of the original for each position of a main scanning direction when the original has been read;

obtaining from a storage unit a shift amount of a sub-scanning direction to an ideal scanning line of an optical beam used for image formation in the image forming apparatus, for each position of the main scanning direction;

calculating a color shift correction amount for correcting color shift in an output image by adding the skew amount calculated for each position of the main scanning direction and the shift amount obtained for each position of the main scanning direction;

correcting the color shift based on the calculated color shift correction amount; and determining whether or not a pixel of interest coordinate in an image in which the color shift has been corrected is equal to or larger than a skew amount offset, wherein when it is determined that the pixel of interest coordinate is equal to or larger than the skew amount offset, data of the pixel of interest is output to an engine, wherein when it is determined that the pixel of interest coordinate is smaller than the skew amount offset, reading out of the pixel of interest is skipped, and wherein the skew amount offset indicates a drawing position in the main scanning direction based on the skew amount of the original.

7. A non-transitory computer-readable recording medium on which is recorded a program for executing on a computer the color shift correction method of the image forming apparatus according to claim 6.

* * * * *